United States Patent
Kunkel et al.

(10) Patent No.: US 6,566,219 B2
(45) Date of Patent: May 20, 2003

(54) METHOD OF FORMING A SELF ALIGNED TRENCH IN A SEMICONDUCTOR USING A PATTERNED SACRIFICIAL LAYER FOR DEFINING THE TRENCH OPENING

(75) Inventors: Gerhard Kunkel, Radebeul (DE); Shahid Butt, Ossining, NY (US); Ramachandra Divakaruni, Ossining, NY (US); Armin M. Reith, Muenchen (DE); Munir D. Naeem, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/957,937

(22) Filed: Sep. 21, 2001

(65) Prior Publication Data

US 2002/0068400 A1 Jun. 6, 2002

Related U.S. Application Data

(60) Provisional application No. 60/234,502, filed on Sep. 22, 2000.

(51) Int. Cl.[7] .............................................. H01L 21/475
(52) U.S. Cl. ...................... 438/386; 438/763; 438/764; 438/787
(58) Field of Search ................................ 438/386, 243, 438/424, 430, 758, 763, 764, 787

(56) References Cited

U.S. PATENT DOCUMENTS

| | | |
|---|---|---|
| 4,920,065 A | 4/1990 | Chin et al. |
| 5,028,980 A | 7/1991 | Teng |
| 5,296,410 A | 3/1994 | Yang |
| 5,328,810 A | 7/1994 | Lowrey et al. |
| 5,330,879 A | 7/1994 | Dennison |
| 5,893,735 A * | 4/1999 | Stengl et al. ............... 438/243 |
| 5,959,325 A | 9/1999 | Adair et al. |
| 5,985,729 A * | 11/1999 | Wu ............................ 438/389 |
| 6,037,209 A | 3/2000 | Rösner et al. |
| 6,124,206 A * | 9/2000 | Flietner et al. ............. 438/692 |
| 6,143,599 A * | 11/2000 | Kim et al. .................. 438/243 |
| 6,165,836 A * | 12/2000 | Forbes et al. ............... 438/243 |
| 6,331,459 B1 * | 12/2001 | Gruening .................... 438/243 |

OTHER PUBLICATIONS

"Self–Aligned Polycide Bit Line Structure," IBM Technical Disclosure Bulletin, vol. 30 No. 12, May 1998, pp. 109–110.

* cited by examiner

Primary Examiner—Carl Whitehead, Jr.
Assistant Examiner—Stephen W. Smoot
(74) Attorney, Agent, or Firm—Slater & Matsil, L.L.P.

(57) ABSTRACT

A method of forming a trench can be used in the fabrication of dynamic random access memory (DRAM) cells. In one aspect, a first layer of a first material (e.g., polysilicon) is formed over a semiconductor region (e.g., a silicon substrate). The first layer is patterned to remove portions of the first material. A second material (e.g., oxide) can then be deposited to fill the portions where the first material was removed. After removing the remaining portions of the first layer of first material, a trench can be etched in the semiconductor region. The trench would be substantially aligned to the second material.

25 Claims, 23 Drawing Sheets

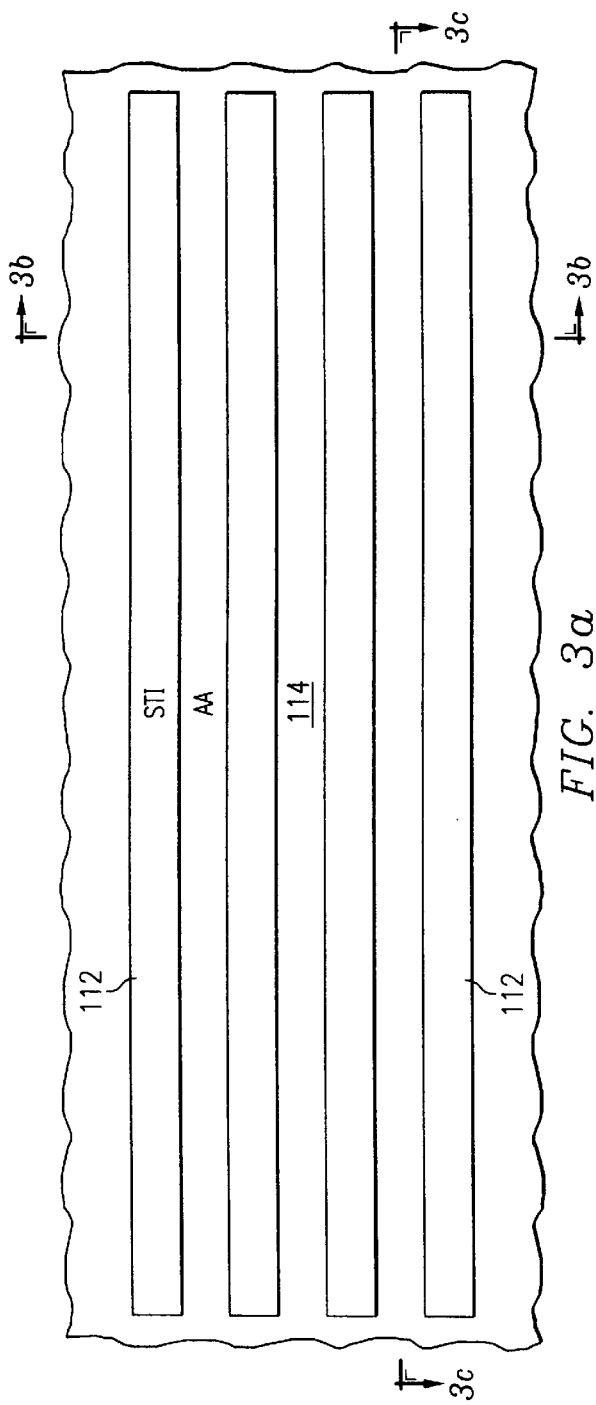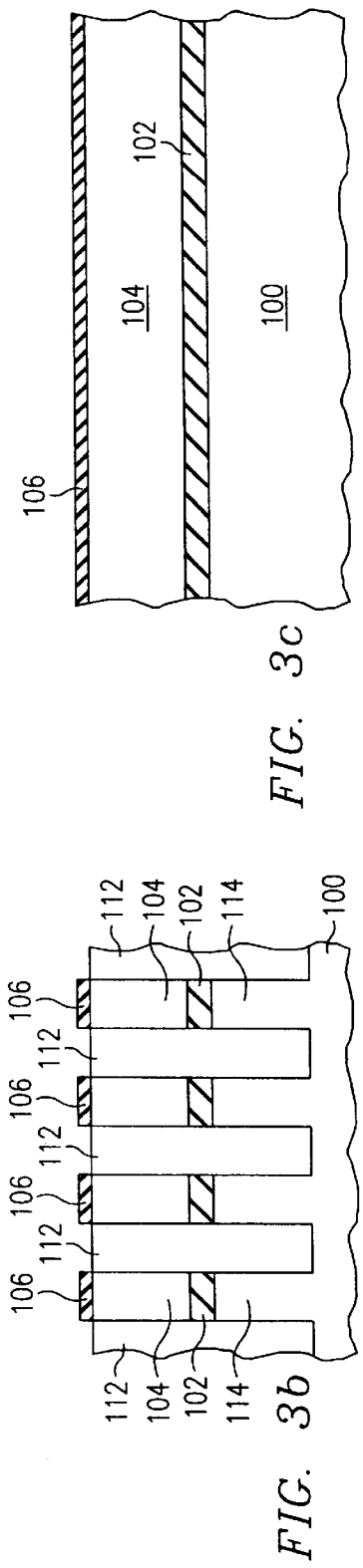
FIG. 3a
FIG. 3b
FIG. 3c

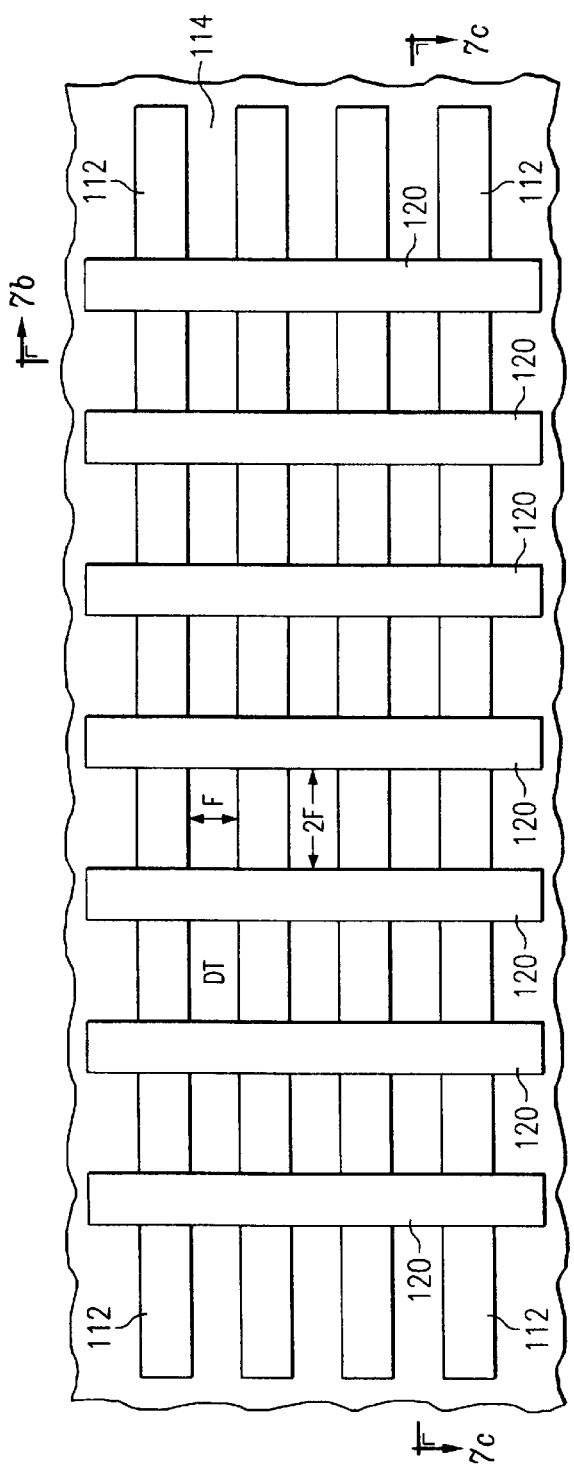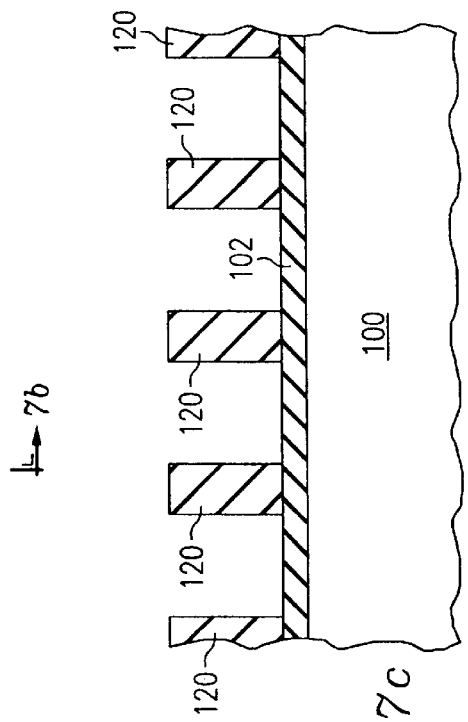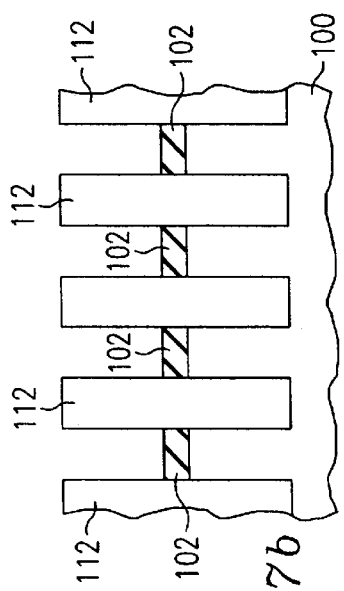
FIG. 7a
FIG. 7c
FIG. 7b

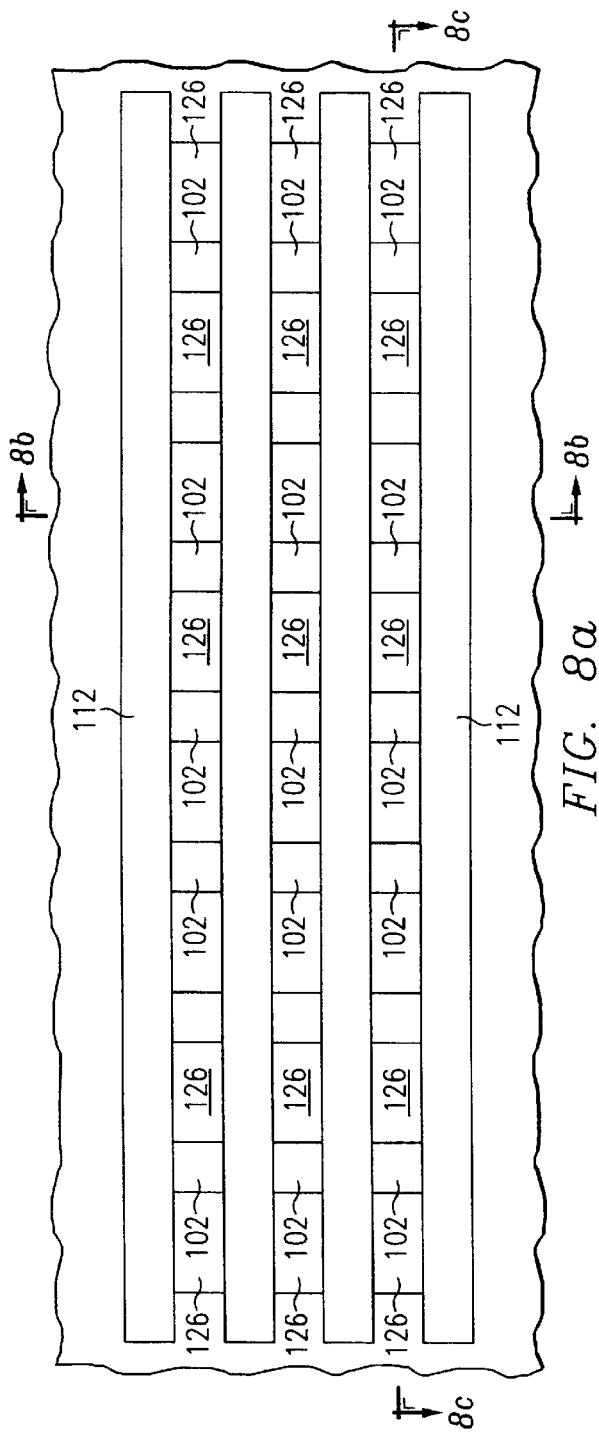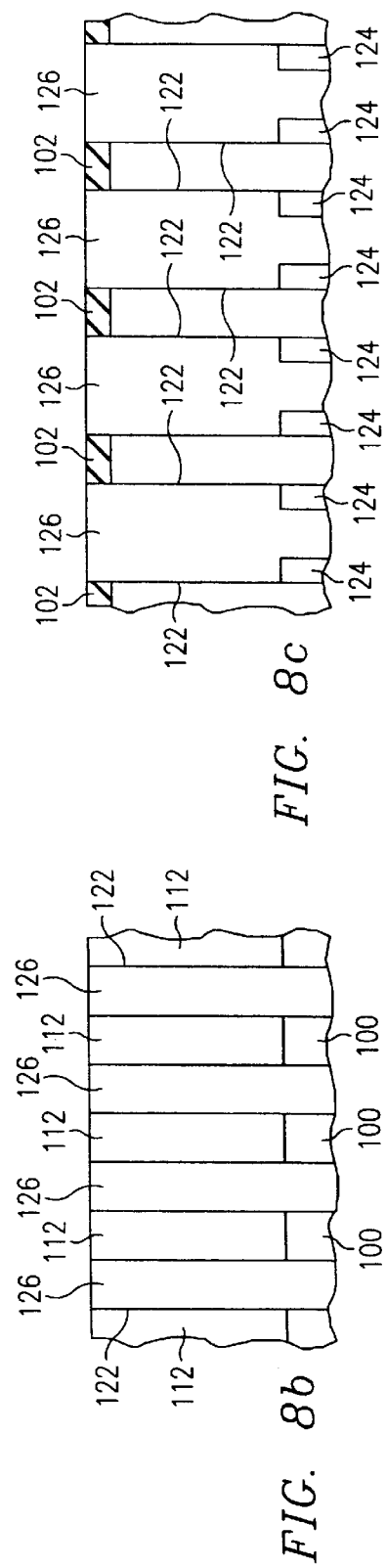

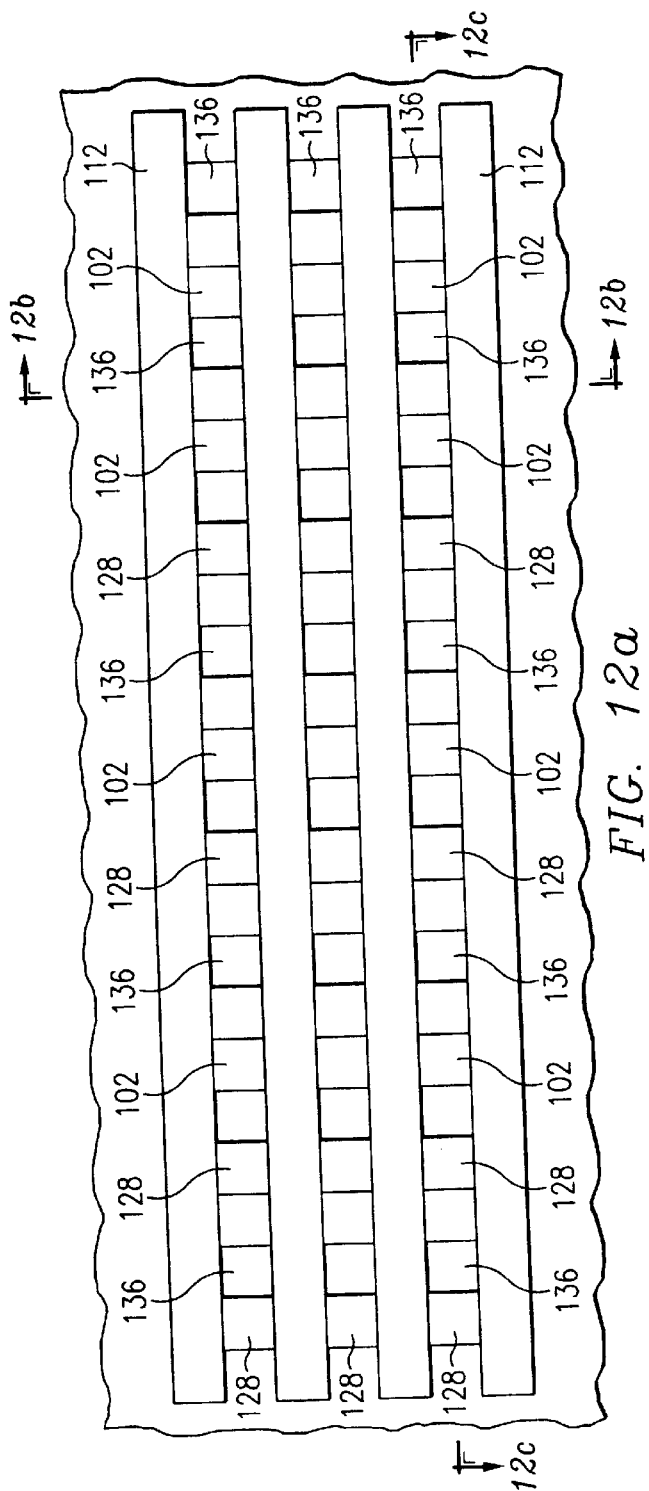
FIG. 12a
FIG. 12b
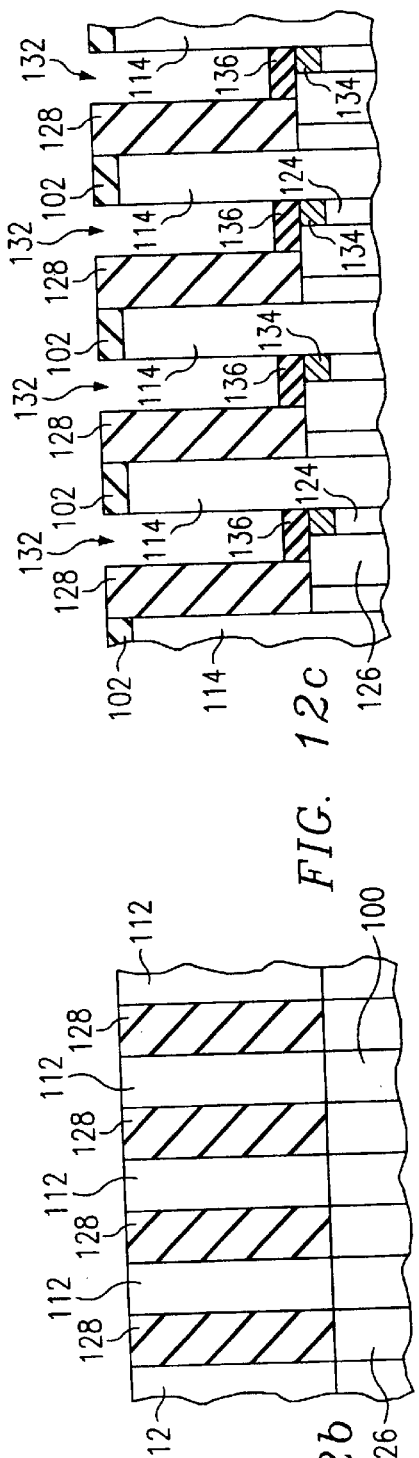
FIG. 12c

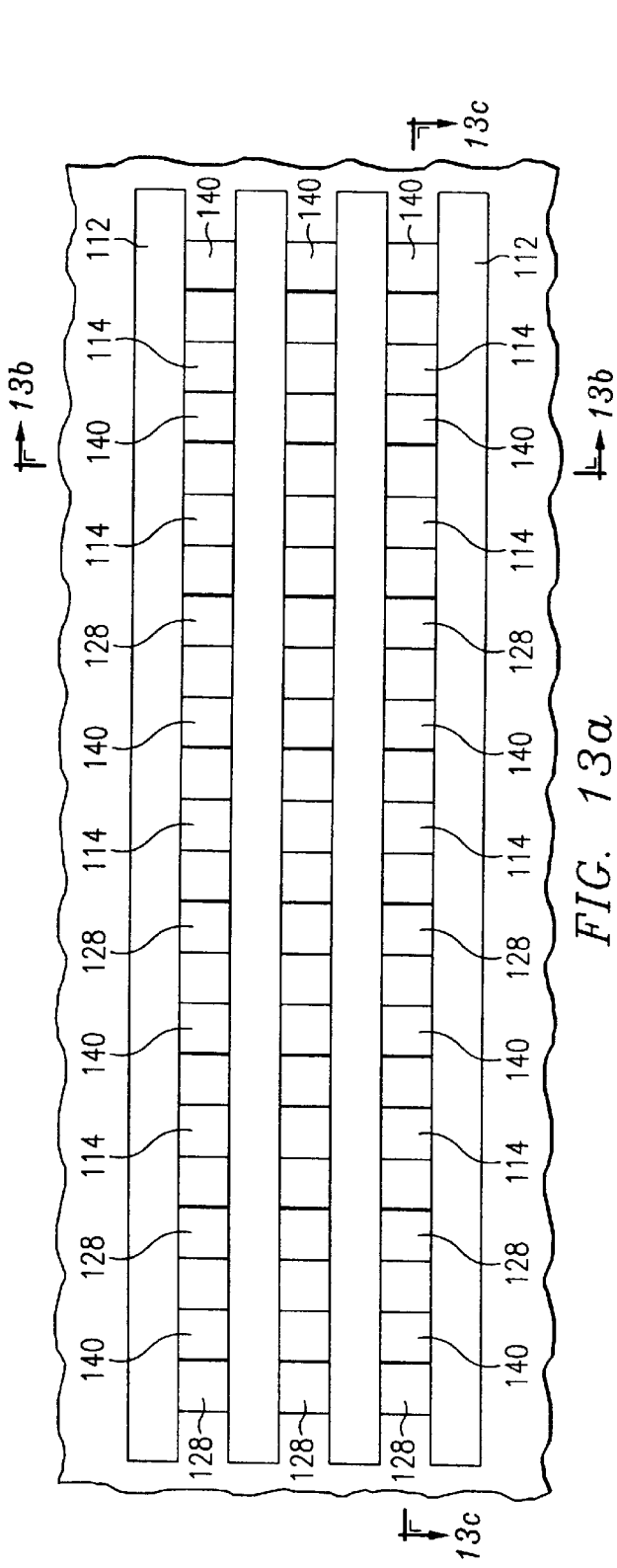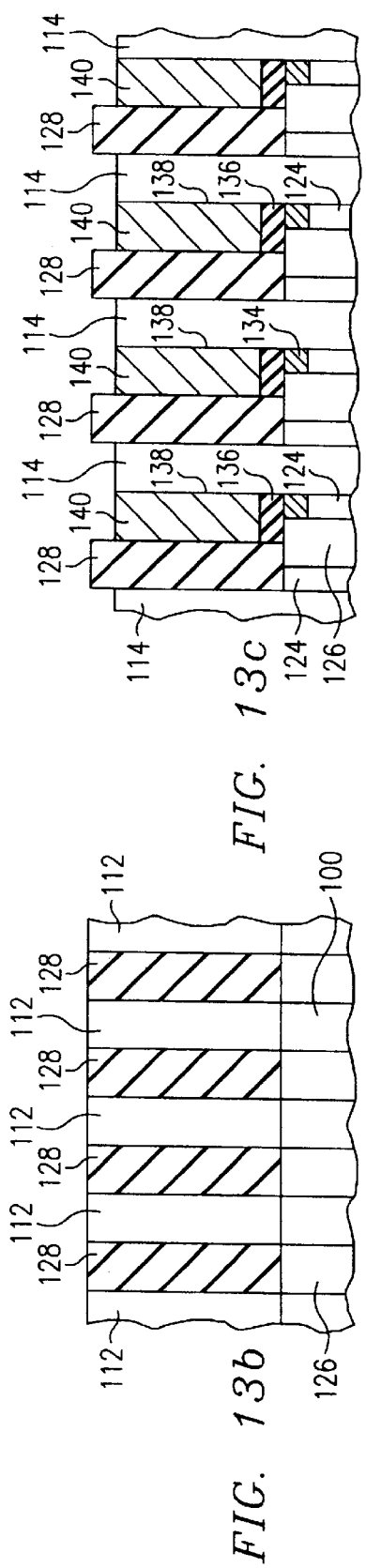
FIG. 13a
FIG. 13c
FIG. 13b

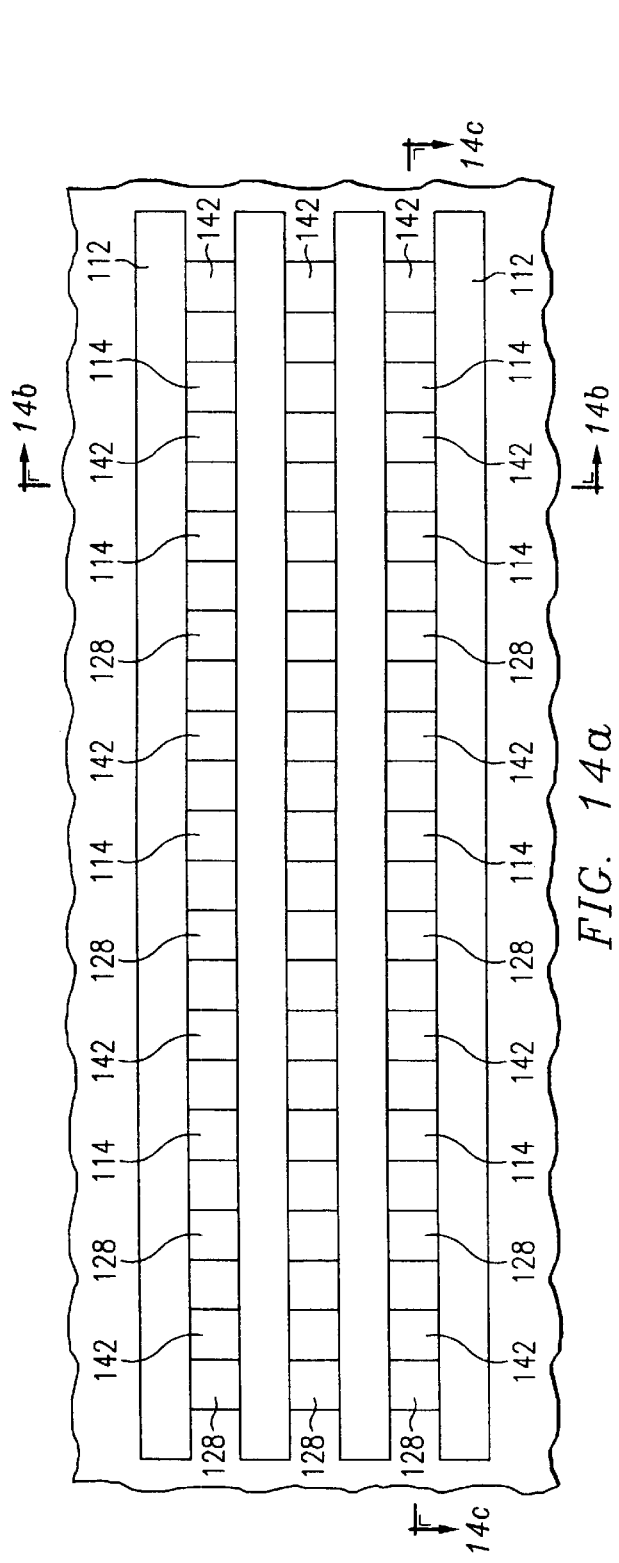
FIG. 14a
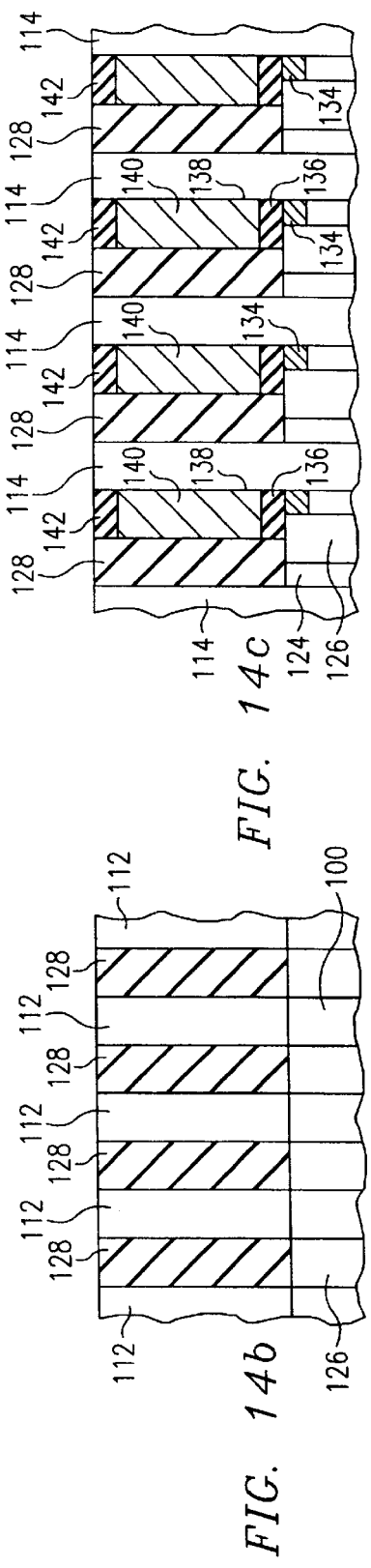
FIG. 14c
FIG. 14b

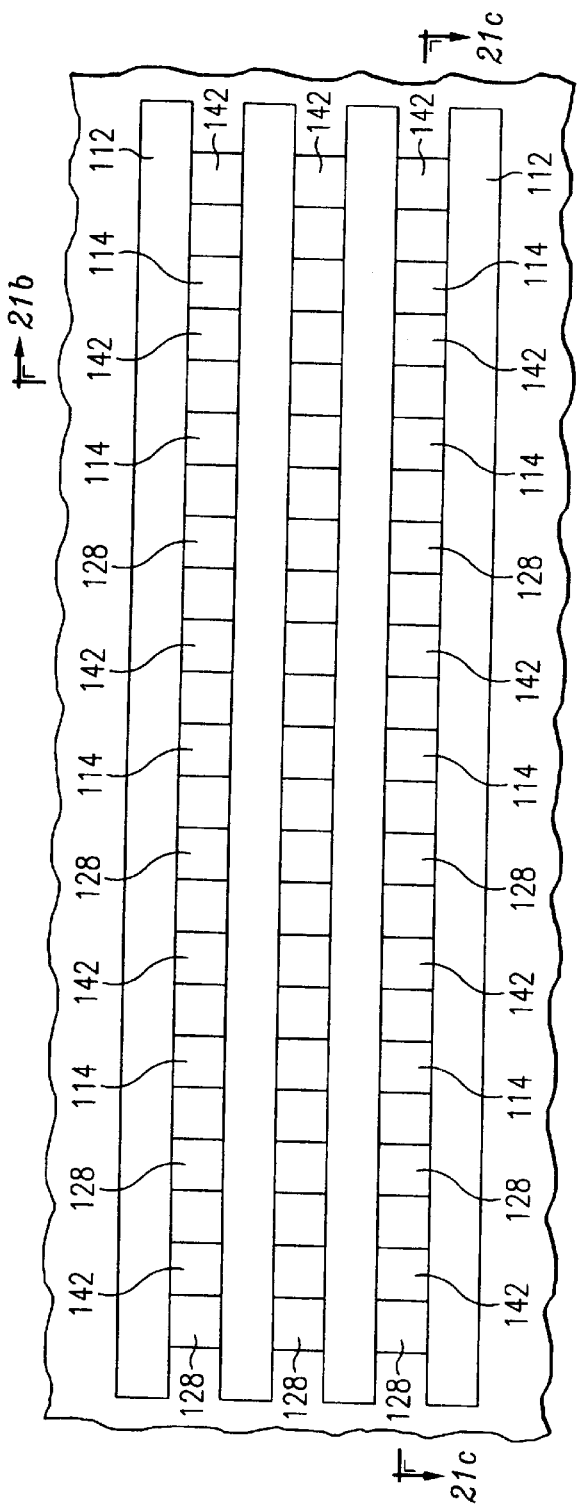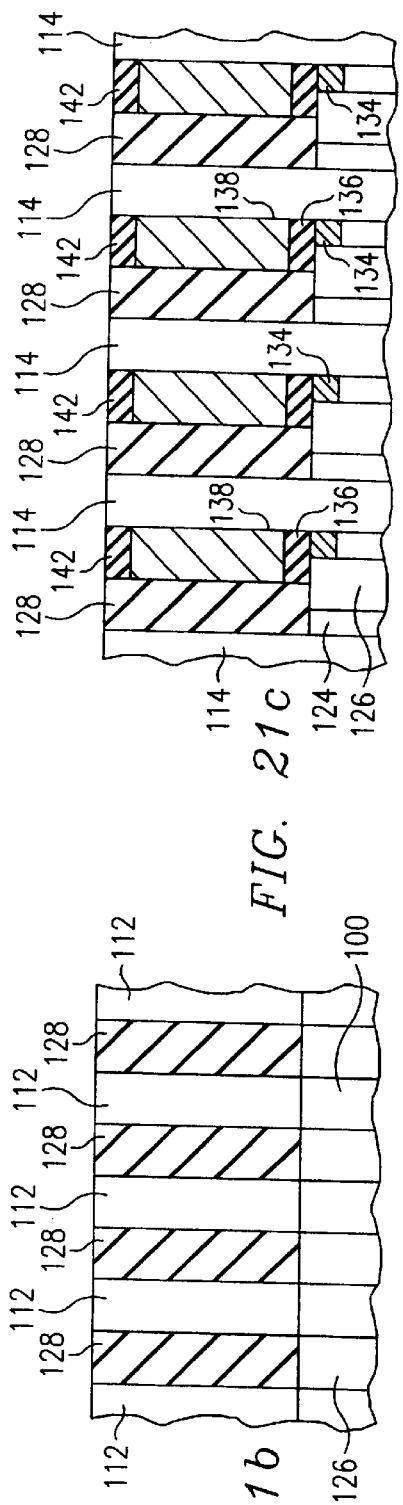
FIG. 21a
FIG. 21b
FIG. 21c

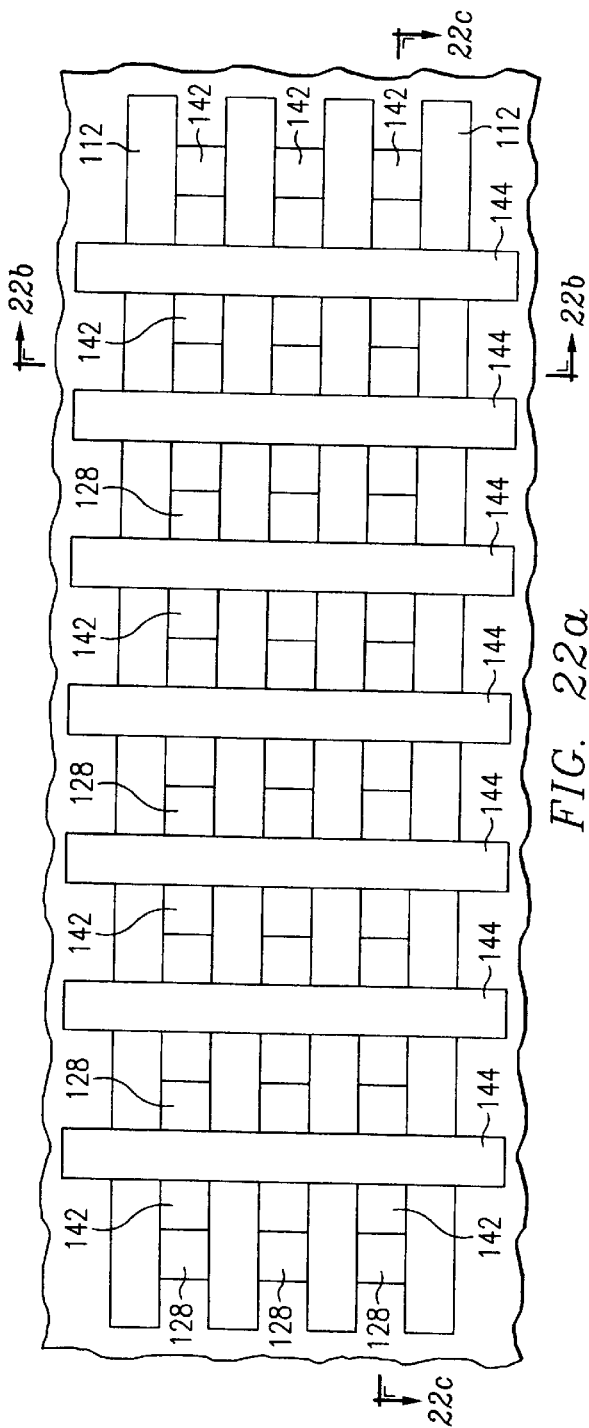
FIG. 22a
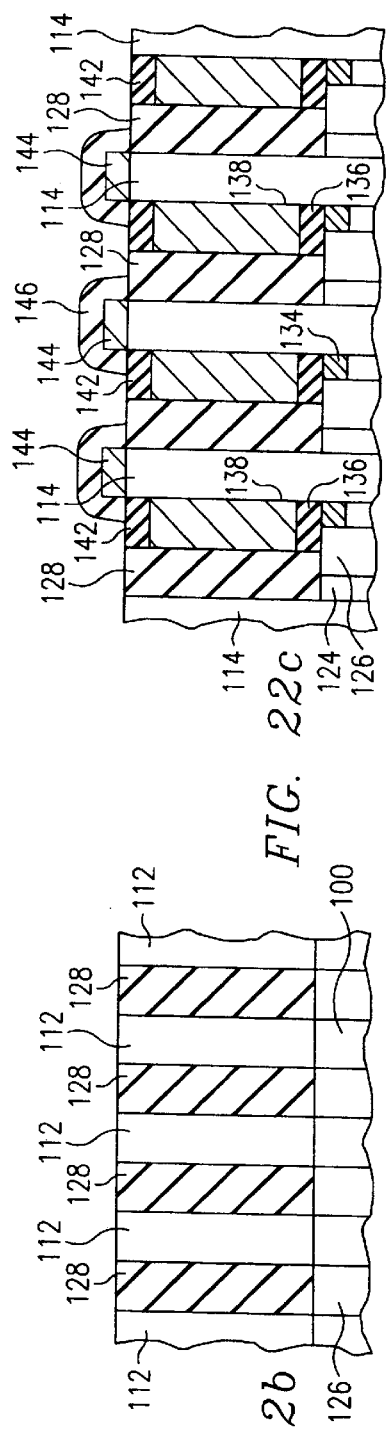
FIG. 22c
FIG. 22b

METHOD OF FORMING A SELF ALIGNED TRENCH IN A SEMICONDUCTOR USING A PATTERNED SACRIFICIAL LAYER FOR DEFINING THE TRENCH OPENING

This patent claims the benefit of provisionally filed patent application Ser. No. 60/234,502 filed Sep. 22, 2000 and entitled "Self Method of Forming the Same," which provisional application is incorporated herein by reference.

FIELD OF THE INVENTION

The present invention relates generally to semiconductor devices more particularly to a trench memory device with a vertical transistor and method of forming the same.

BACKGROUND OF THE INVENTION

As is known in the art, dynamic random access memories (DRAMs) are used extensively in a wide range of applications. A DRAM typically includes an array of memory cells, each cell comprising a pass transistor, typically a metal oxide semiconductor field effect transistor (MOSFET), coupled in series with a capacitor.

A portion 10 of an array is shown in FIG. 1, which illustrates two complementary pairs of bitlines BL and BL'. While this figure only illustrates eight memory cells, it is known to fabricate DRAMs with over one billion cells. Each bitline pair BL and BL' is coupled to equalization/precharge circuitry and a sense amplifier, collectively labeled 12. Although not illustrated, many bitline pairs (and respective circuitry 12) will be provided.

Each memory cell includes a pass transistor 14 coupled in series with a capacitor 16. As shown in the figure, one source/drain region of transistor 14 is coupled to the bitline BL (or BL'). The other source/drain region is coupled to one of the plates of respective capacitor 16. The other plate of capacitor 16 is coupled to a common plate reference voltage.

To select a particular memory cell, a select voltage is applied to one of the wordlines WL0–WL3. As illustrated in FIG. 1, the gate of each pass transistor 14 is coupled to one of the wordlines WL0–WL3. As shown, each wordline will extend across other bitlines and couple to the gates of pass transistors of memory cells coupled to those bitlines.

The bitline pair BL0 and BL0' (or BL1 and BL1') is selected by applying a select voltage to the select transistors 18 and 18'. When the select transistors 18 and 18' are selected, the differential voltage signal across the bitline pair will be transferred to input/output lines I/O and I/O'. In this manner, the state stored in the one memory cell that is coupled to the selected wordline and selected bitline will be transferred to the input/output lines.

Semiconductor memory density is typically limited by a minimum lithographic feature size that is imposed by lithographic processes used during fabrication. There is a continuing need in the art to provide even higher density memories in order to further increase data storage capacity and reduce manufacturing costs.

One way of increasing the data storage capacity of semiconductor memories is to reduce the amount of integrated circuit horizontal planar area consumed by each memory cell. For horizontally oriented devices, this may be done by decreasing the size of the access FET or the storage capacitor, or both. This approach has limits, however, due to minimum producible structure size in a given fabrication technology, and the problems associated with devices with small dimensions, such as hot carriers, punch through, and excess leakage.

Another way of providing planar area reduction is the use of a three-dimensional arrangement of the access FET and the storage capacitor. One such arrangement is a planar FET next to a deep trench capacitor. The trench capacitor has plates which are located vertically along the walls of the trench instead of being parallel to the surface of the integrated circuit substrate. This permits a large capacitance per planar unit area of substrate, while at the same time allowing the device to be of a manageable size for purposes of operation.

To still further reduce the amount of planar area required for each cell, it has been proposed to use a vertical trench transistor in conjunction with a vertical trench capacitor in a memory cell. In a typical design, the vertical capacitor is generally fabricated in a trench, with one conductive plate being formed in the substrate, the dielectric being formed on the trench sidewalls, and the other conductive plate being formed in the interior of the trench. A vertical trench transistor is generally fabricated adjacent to an upper portion of the trench, with the source and drain being fabricated in the substrate, and the vertically-oriented gate being fabricated in the trench.

SUMMARY OF THE INVENTION

In one aspect, the present invention is related to the formation of a trench in a semiconductor region. In one aspect, a first layer of a first material (e.g., polysilicon) is formed over a semiconductor region (e.g., a silicon substrate). The first layer is patterned to remove portions of the first material. A second material (e.g., oxide) can then be deposited to fill the portions where the first material was removed. After removing the remaining portions of the first layer of first material, a trench can be etched in the semiconductor region. The trench would be substantially aligned to the second material.

This process can be advantageously used in the formation of a dynamic random access memory (DRAM) device. In such a DRAM process, the deep trench could be self-aligned with the active area. In other process flows, a significant problem is often found with the formation of the deep trench. If the deep trench is formed before the active area, an overlay problem may occur. This misalignment can influence device performance. The present invention overcomes this problem by forming the active area self aligned to the deep trench. As a result, no overlay is required.

Using this process can lead to smaller device cells. Efforts to realize cell sizes below $8F^2$ (where F is the minimum feature size) suffer from either low capacitance area or/and increased sensitivity to overlay. One reason is the strong dependence of the deep trench RIE (reactive ion etch) depth to the deep trench opening. The layout of the preferred embodiment of the present invention provides a complete self-aligned active area to deep trench process flow and a deep trench opening of 1F×2F. This deep trench size should provide sufficient capacitance to obtain storage capacitance of at least about 35fF for F=135 nm and beyond. All of this is achieved with a memory cell that can be scaled to sub-$6F^2$ cell size.

In addition, the preferred DRAM device uses a single-sided junction, that is there is a single bit for each bitline contact. The concept of a single sided junction leads to a reduced leakage and allows an increased scalability down to 100 nm.

Furthermore, the self-aligned active area to deep trench process provides a well controlled width of the active area. This control leads to a better control of the threshold voltage (Vt) within field, wafer and lot. Since the layout is lithographic friendly, it is possible to build devices with a minimum feature size of 120 nm with commercially available tools.

BRIEF DESCRIPTION OF THE DRAWINGS

The above features of the present invention will be more clearly understood from consideration of the following descriptions in connection with accompanying drawings in which:

FIGS. 2–8 illustrate cross-sectional views of a preferred embodiment process flow to form a trench in a semiconductor region;

FIGS. 9–15 illustrate cross-sectional views of a first embodiment process flow to form a DRAM using the trench of FIG. 8;

FIGS. 20–23 illustrate cross-sectional views of a third embodiment process flow to form a DRAM using the trench of FIG. 8.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

The present invention will now be described using specific examples, namely of dynamic random access memory (DRAM) devices. These examples are provided to more simply convey the advantageous features of the invention.

Figure 1:
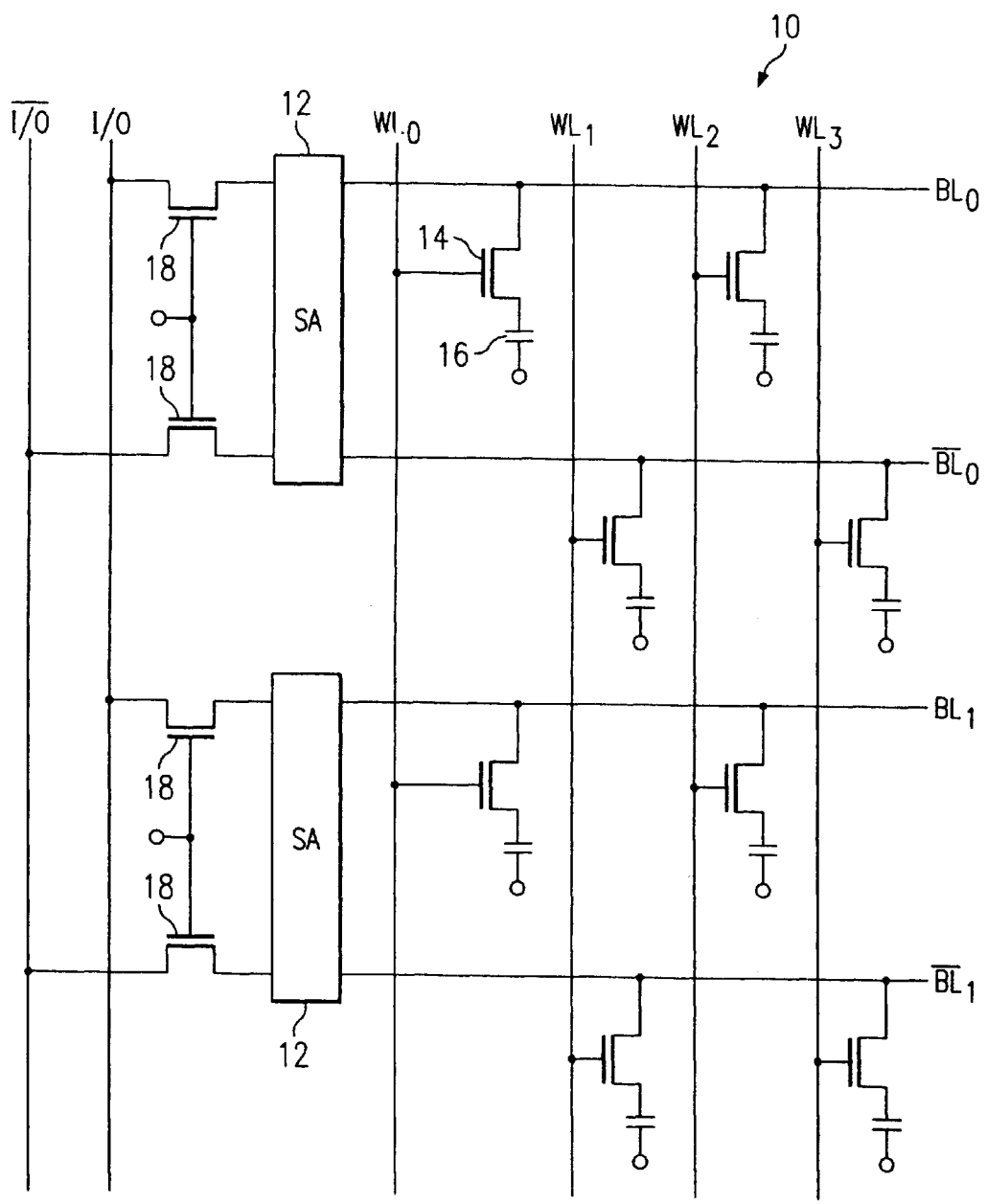
FIG. 1 illustrates a block diagram of a conventional memory array.
Figure 2A:
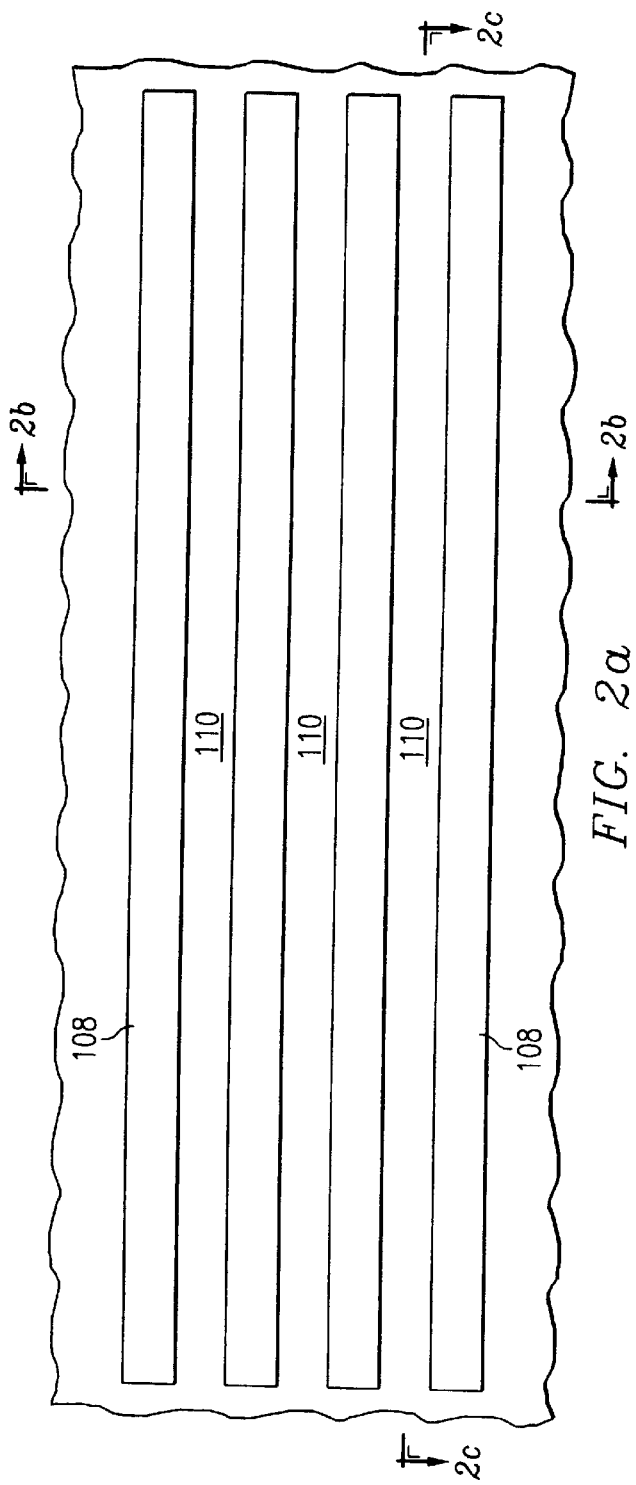
Figure 2C:
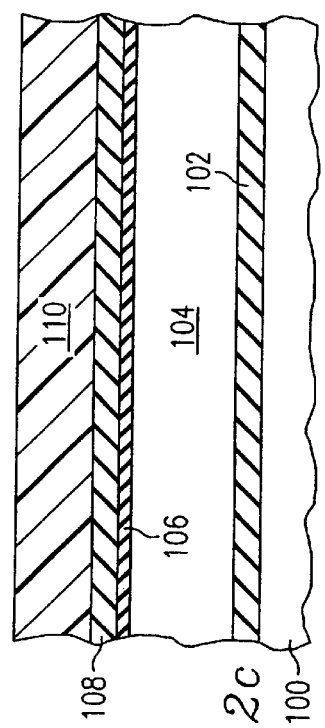
Figure 2B:
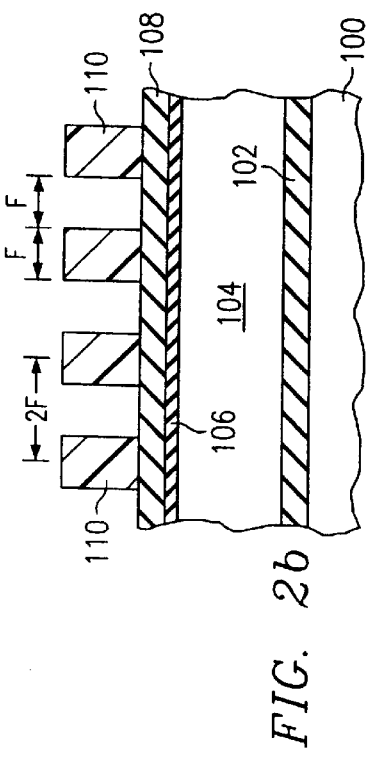

FIGS. 2–15 illustrate a first embodiment for fabricating a DRAM array. In each of these figures three views are shown. For example, FIG. 2a illustrates a plan view, FIG. 2b illustrates a cross-sectional view along the 2b—2b line of FIG. 2a and FIG. 2c illustrates a cross-sectional view along the 2c—2c line of FIG. 2a . At times the three views (e.g., FIGS. 2a–2c are collectively described without the letter (e.g., as FIG. 2).

The memory cell is formed in a semiconductor region 100. In the preferred embodiment, semiconductor region 100 comprises a silicon substrate. In other embodiments, semiconductor region 100 may comprise a semiconductor region over or within another semiconductor region, e.g., an epitaxial layer or a well (or tub or tank). Semiconductor region 100 may also comprise a semiconductor layer grown over an insulator (e.g., silicon-over-insulator or silicon-over-sapphire).

In this embodiment, a number of layers are grown over semiconductor region 100. First a pad nitride layer 102, e.g., Si3N4, is deposited over a grown oxide, e.g., by chemical vapor deposition. A sacrificial polysilicon layer 104 is deposited over the pad nitride 102. A nitride liner 106 is then deposited over the sacrificial polysilicon layer 104 and an oxide layer (preferably doped) 108 over the nitride liner 106. As will be shown below, the selection of these particular materials was based upon finding materials selective to etches used in the fabrication process. The particular materials may be changed in other embodiments.

The thickness of polysilicon layer 104 should be the thickness desired for a hard mask to be used to form the deep trenches (see FIG. 8).

The stack is patterned using photoresist layer 110. As shown in FIG. 2, photoresist 110 is patterned in elongated strips having lines/spaces with a 2F pitch. In this context, F is the minimum feature size (or ground rule or minimum design distance). For example, if the design has a 150 nm ground rule then F would be equal to 150 nm. Photoresist layer 110 can be any known photoresist, preferably one sensitive to ultraviolet radiation.

Referring now to FIG. 3, the portions of oxide layer 108 and nitride liner 106 which are exposed by photoresist 110 are removed to expose portions of polysilicon layer 104. Standard etching techniques can be used. The photoresist 110 is then removed and polysilicon layer 104 and pad nitride 102 are etched selective to oxide. After the exposed portions of pad nitride 102 are removed, a silicon etch is performed to create shallow trenches to a depth defined by the strap, which will be formed later (see strap 134 in FIG. 11). This depth is typically about 600 nm below the silicon surface.

The remaining portions of oxide layer 108 are then stripped and the shallow trenches are filled with an insulating material, thus creating the STI (shallow trench isolation) regions 112. The portions 114 of semiconductor region 100 between the STI regions can be referred to as the active area (AA). The source and drain of the vertical pass transistor will be formed in this area. After forming the STI, the wafer is planarized to the nitride layer 106. A chemical-mechanical polish can be used for the planarization. Since the aspect ratio of the fill is high, special techniques can be utilized.

Figure 4A:
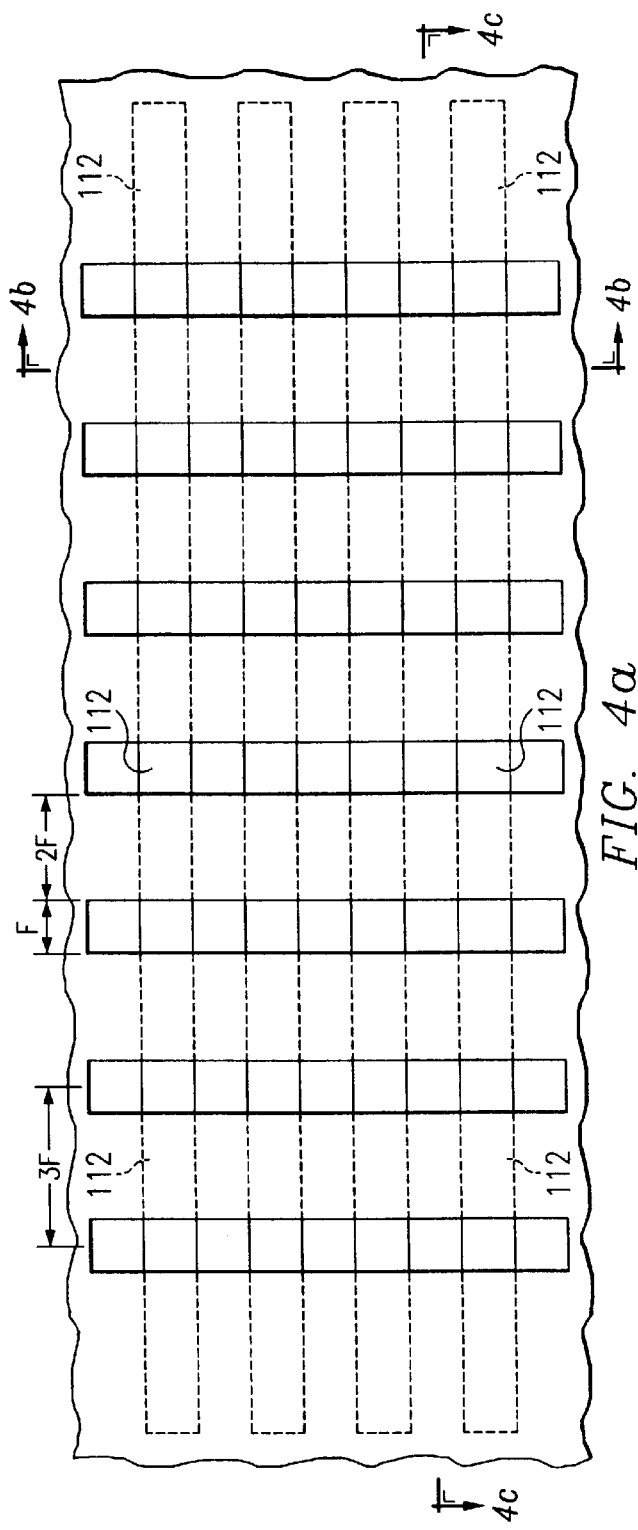
Figure 4C:
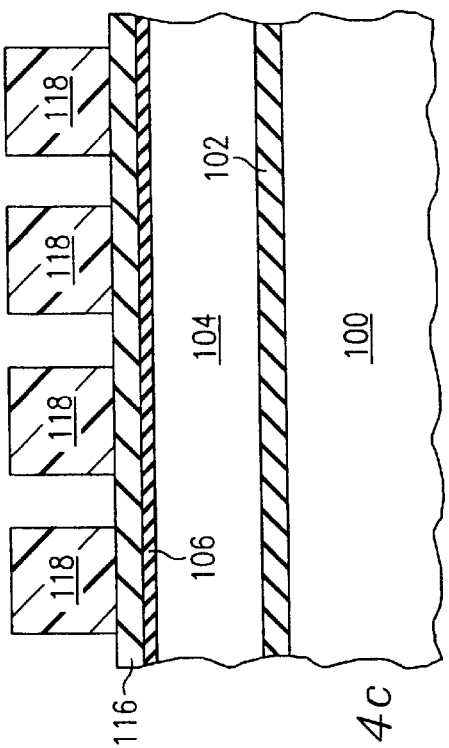
Figure 4B:
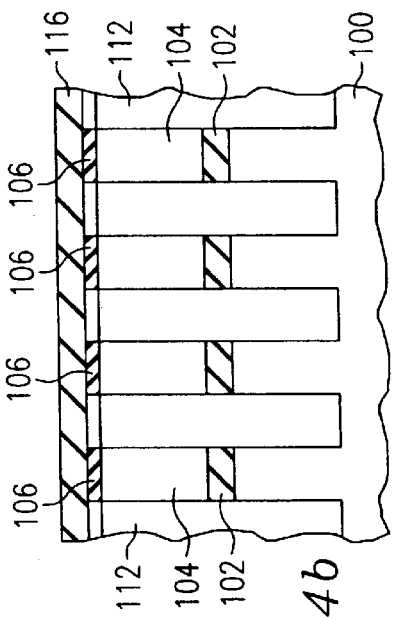

Referring now to FIG. 4, another thin oxide layer 116 is deposited over the surface of the device. Photoresist layer 118 is then used to pattern this layer 116 with 2F lines on a 3F pitch perpendicular to the first lines and space pattern. This pattern will be used to define the extent of both the active area 114 and deep trench (122 of FIG. 8).

Figure 5A:
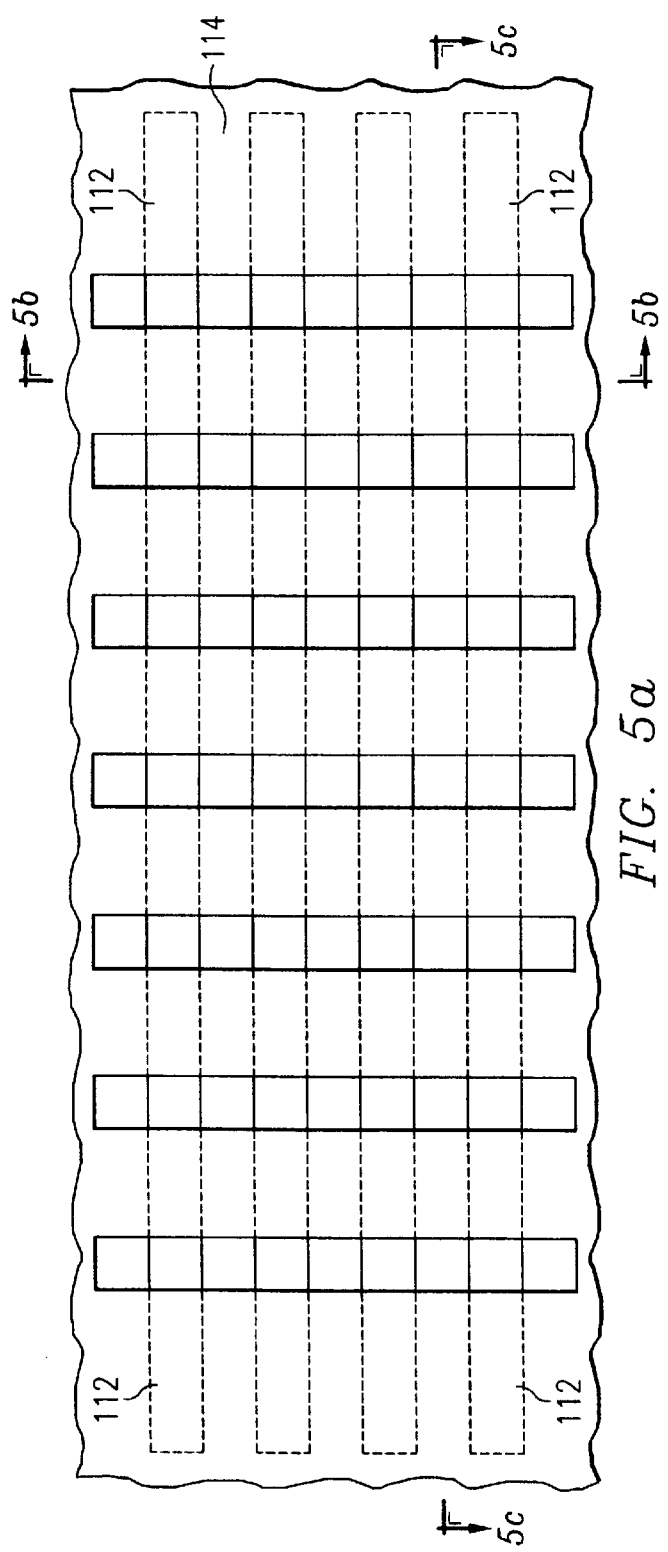
Figure 5C:
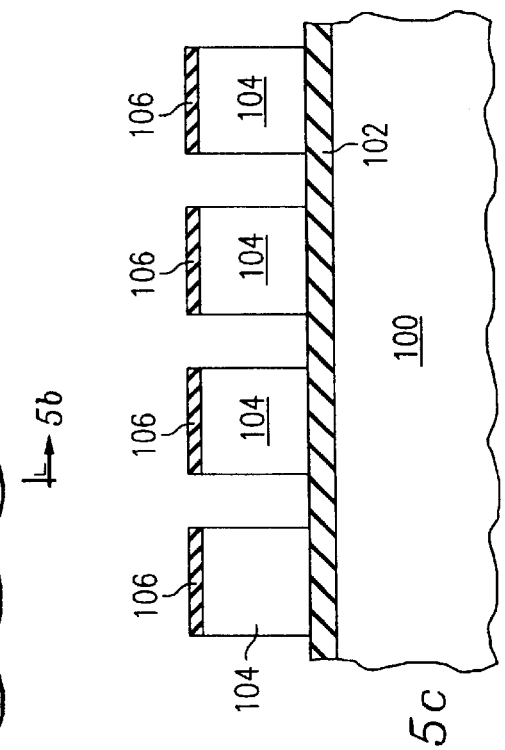
Figure 5B:
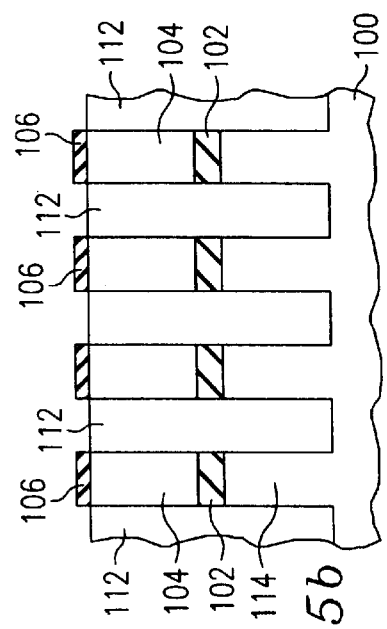

The oxide layer 116 and nitride liner 106 are then etched using photoresist 118 as a mask. The photoresist is then removed and polysilicon layer 104 is etched selective to oxide. In other words, oxide layer 116 is used as the etch mask. This etch is stopped at the nitride layer 102. The resulting structure is illustrated in FIG. 5.

Figure 6A:
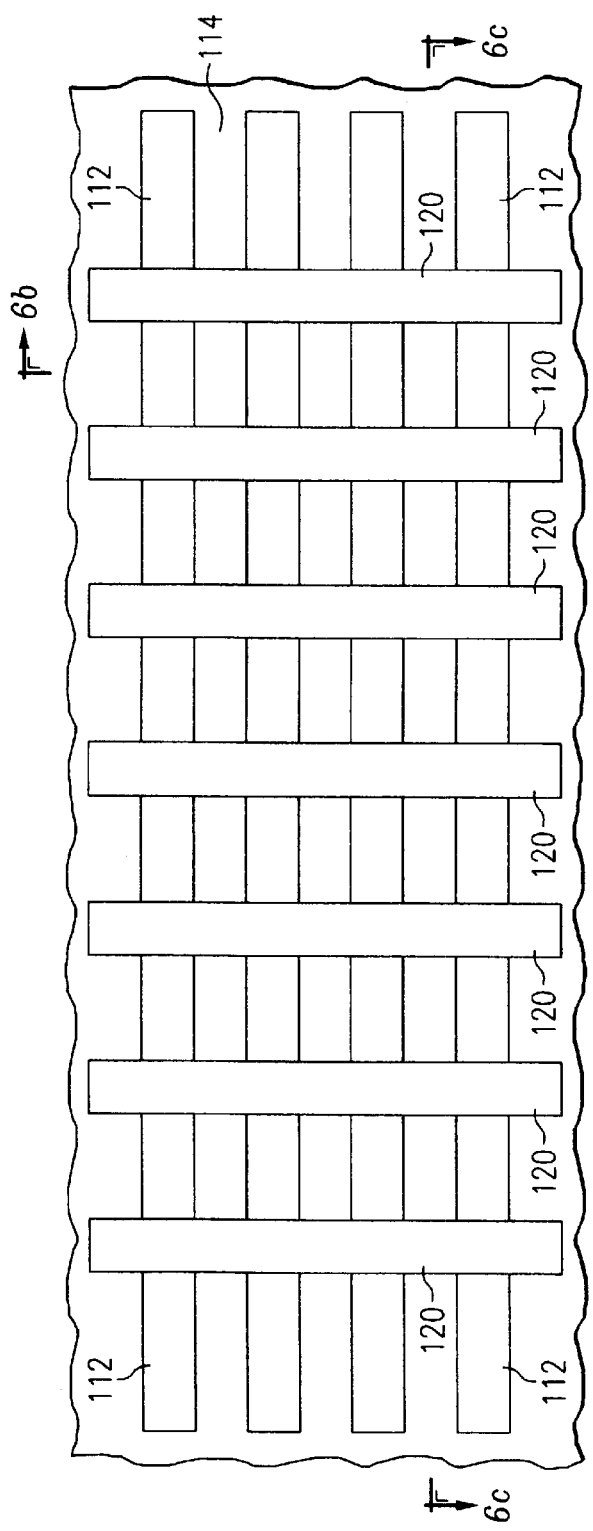
Figure 6C:
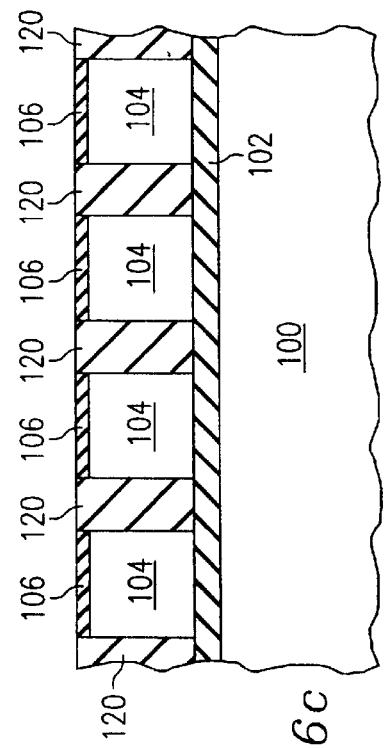
Figure 6B:
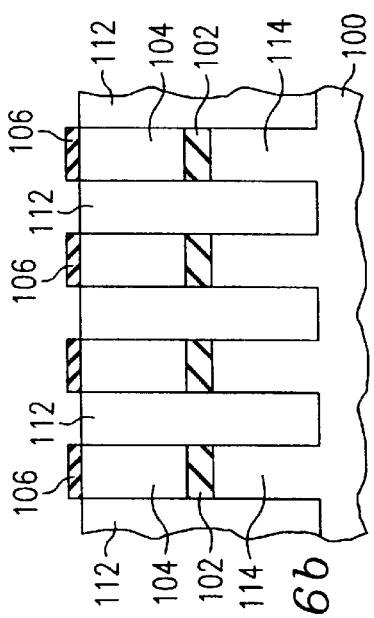

Referring now to FIG. 6, the etched line pattern is filled with oxide 120, for example by the decomposition of tetraethyloxysilane (TEOS). Once again the upper surface of the device can be planarized to the nitride liner 106, for example using chemical-mechanical polishing (CMP). The oxide region 120 will be the hard mask for etching the deep trench (122 in FIG. 8).

Referring now to FIG. 7, the remaining portions of nitride layer 106 polysilicon layer 104 are removed. This step provides the pattern for the deep trench formed in FIG. 8. As shown in FIG. 7, the shape of the deep trench is 1F by 2F. It should also be noted that at this point, the active area process is complete and the deep trench mask open is done in a self-aligned manner. In other words, no mask alignment is necessary to form the active area.

Referring now to FIG. 8, portions of pad nitride 102 that are exposed by oxide layer 120 are removed to expose silicon region 100. Deep trenches 122 are formed by etching silicon region 100 using oxide layer 120 as an etch mask to about 7$\mu$m by known methods. The buried plate and node are formed as is known in the art.

After the remainder of oxide layer 120 is stripped, oxide collar 124 is formed, preferably by the local oxidation of silicon (locos). The trench 122 is then filled with a conductive material such as doped polysilicon.

Figure 9A:
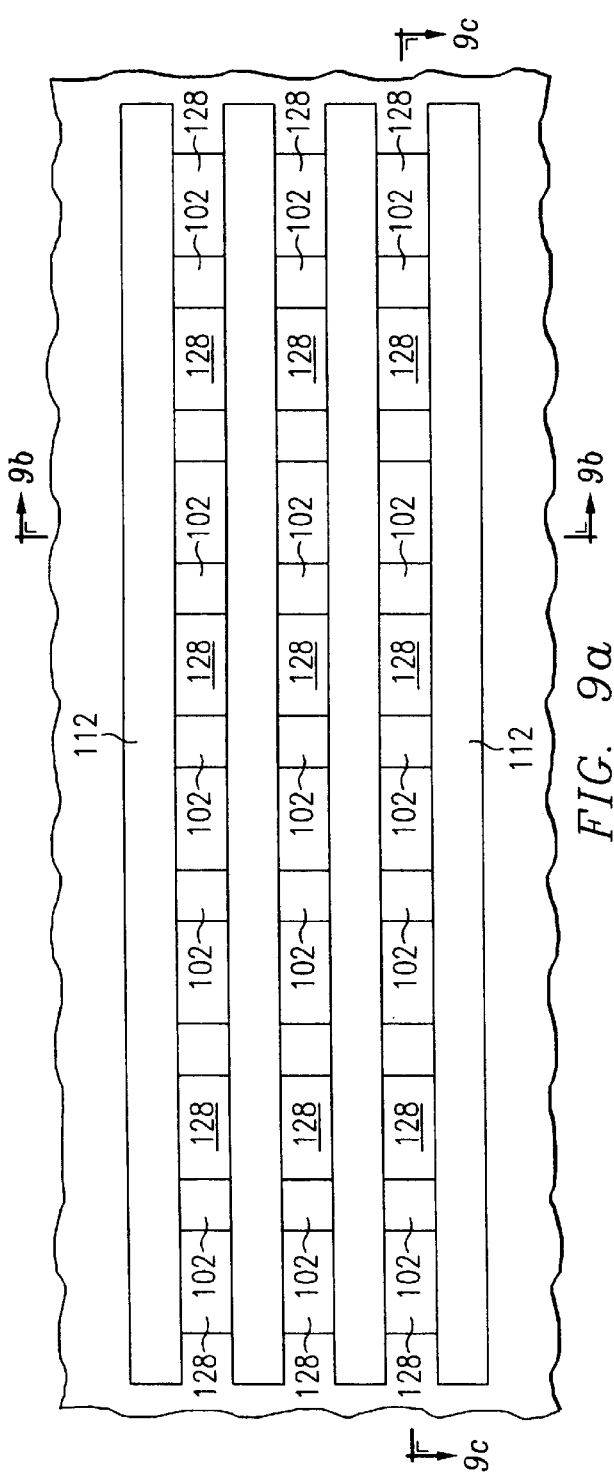
Figure 9C:
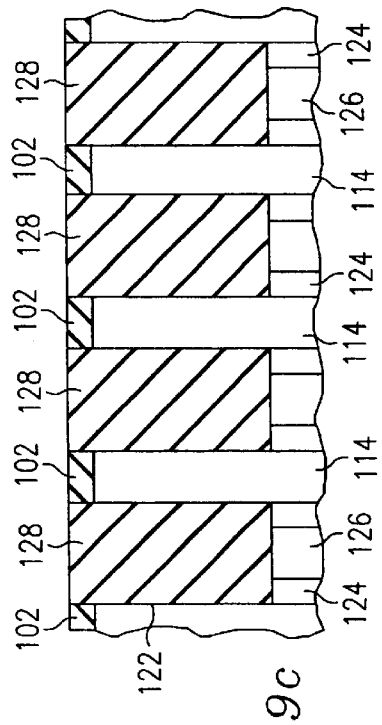
Figure 9B:
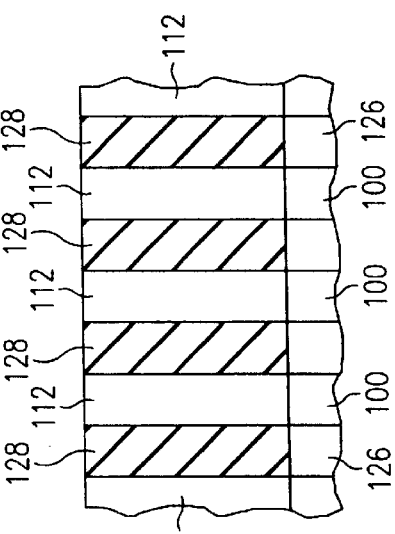

Referring now to FIG. 9, the polysilicon 126 within trench 122 is recessed down to the oxide collar 124. The recessed portion of trench 122 is then filled with a dielectric 128, preferably oxide. An oxide CMP to the nitride layer 102 can then be performed to provide a planar surface for the next patterning (e.g., deep ultra-violet) step.

Figure 10A:
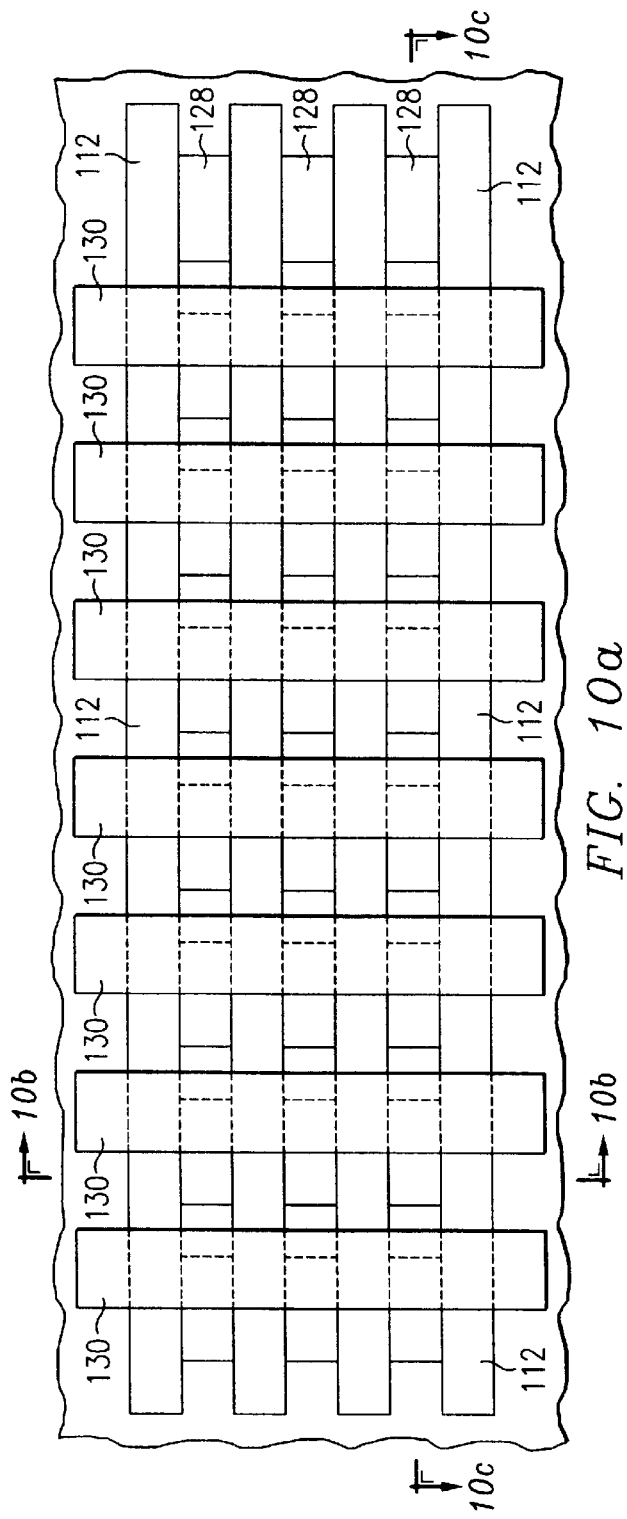
Figure 10C:
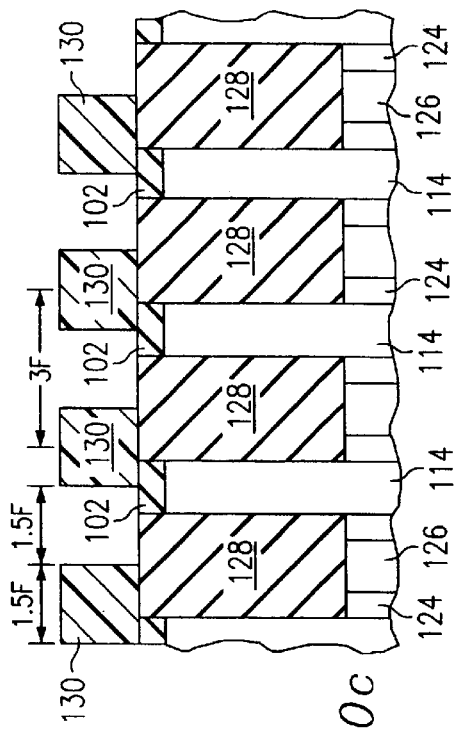
Figure 10B:
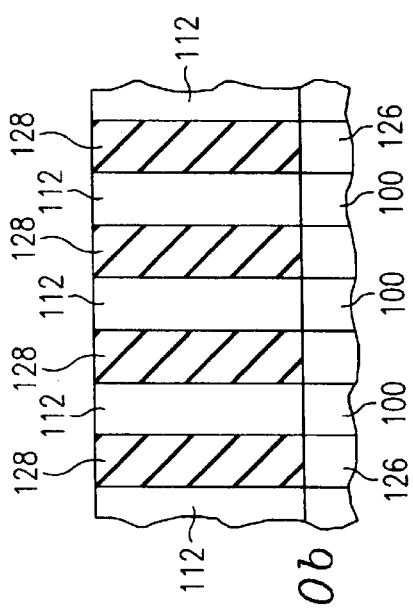

As shown in FIG. 10, photoresist layer 130 is formed over the device. This resist is patterned with 1.5F lines and a 3F pitch. In doing so, half of the trench 122 (the upper portion of which is now filled with oxide material 128) and half of the active area 114 (still covered by nitride layer 102) will be exposed and half masked by resist layer 130.

Figure 11A:
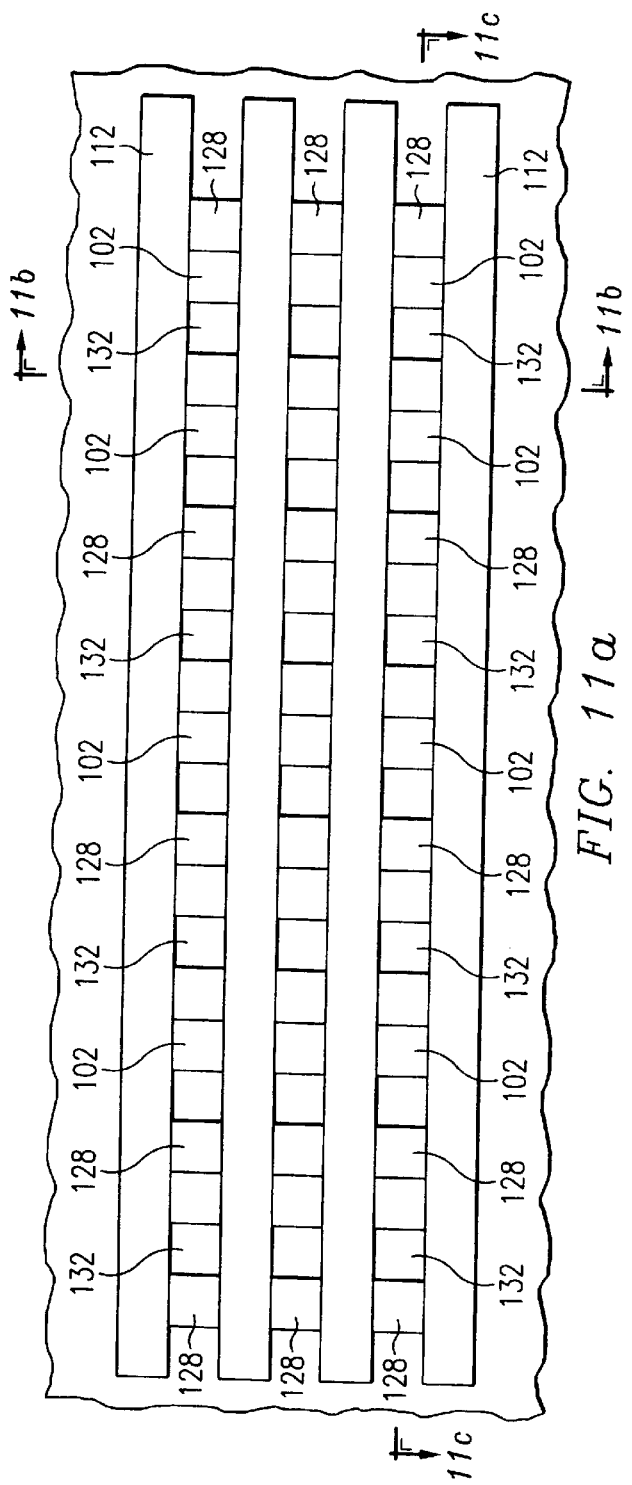
Figure 11C:
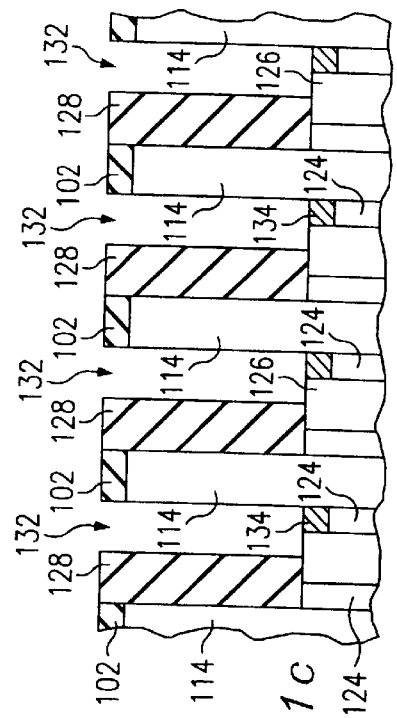
Figure 11B:
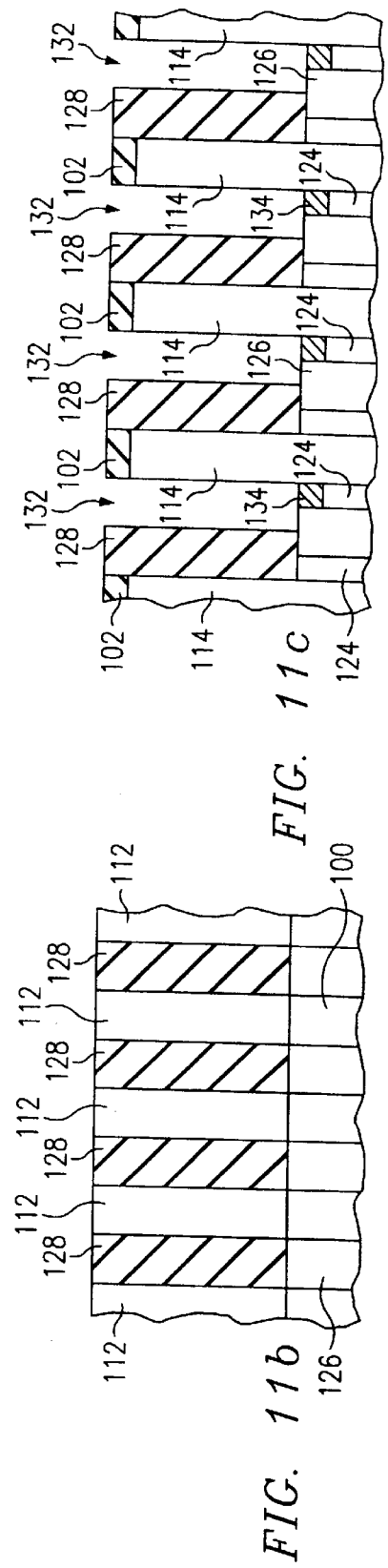
Figure 15A:
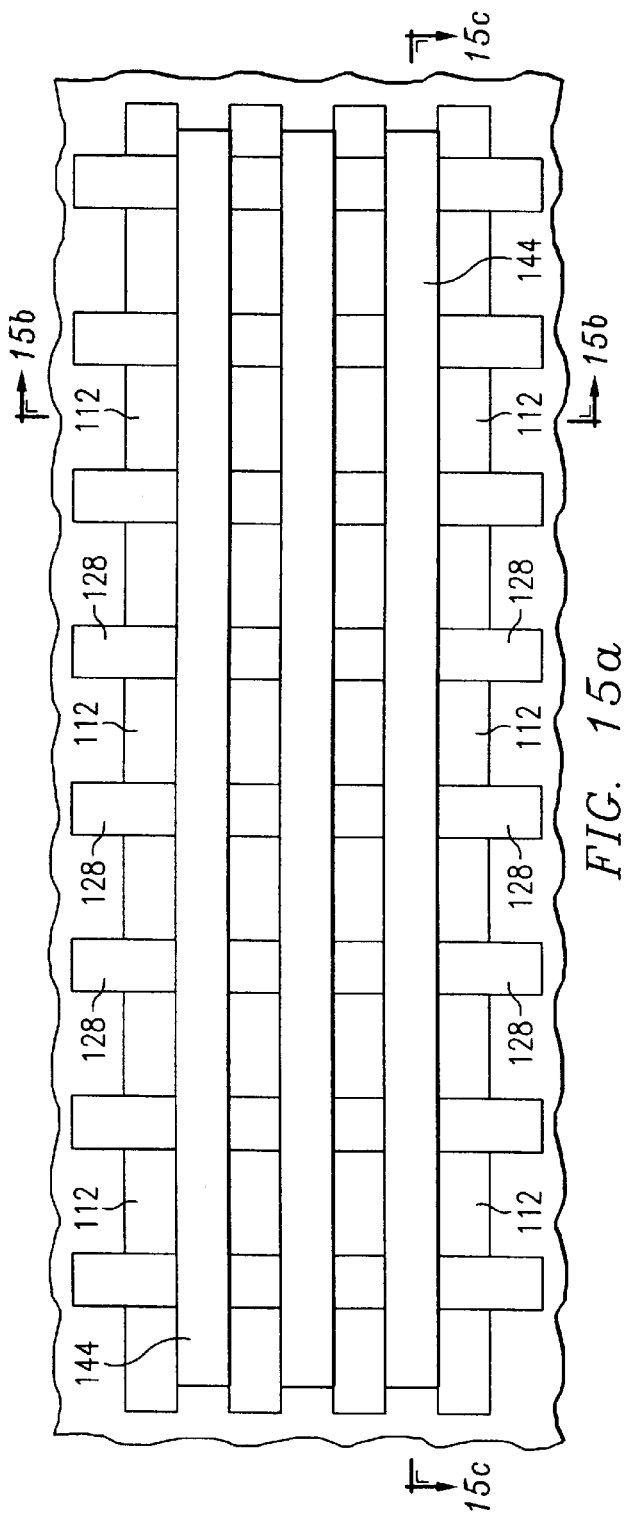
Figure 15C:
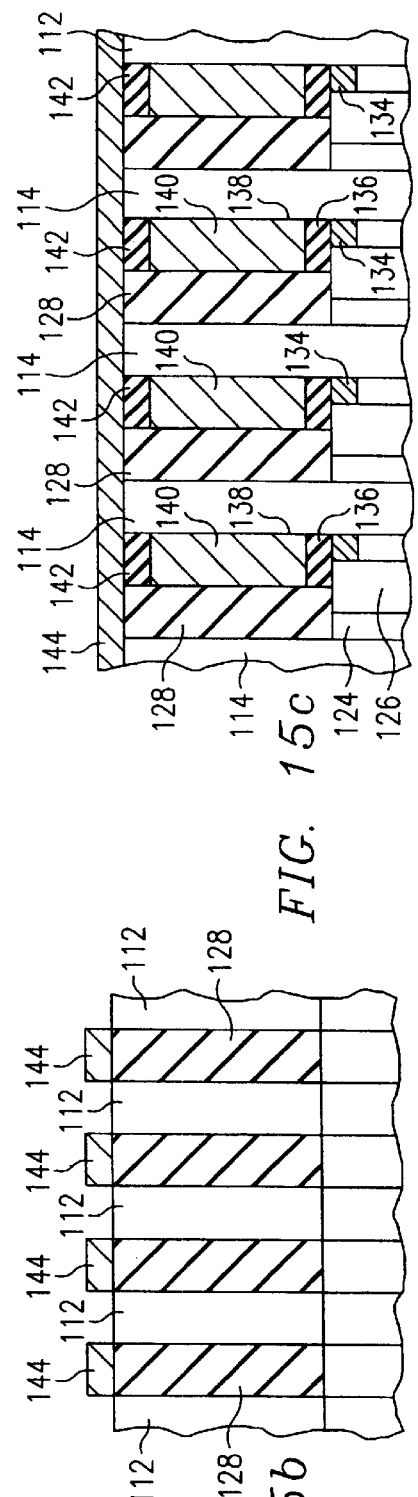
Figure 15B:
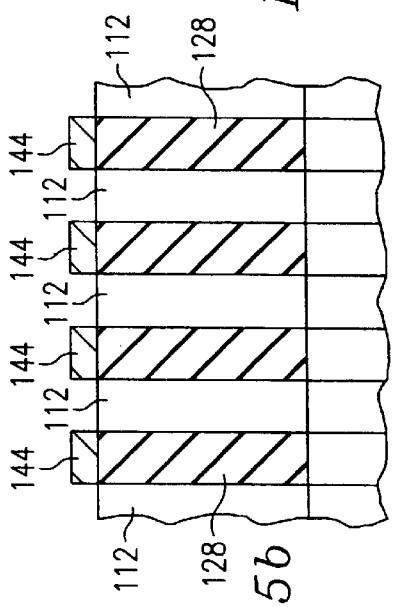

Using the patterned photoresist 130 as a mask, the oxide material 128 is removed from a portion of trench 122. This removal creates an opening 132, which is along one side of trench 122 and exposes the silicon of active area 114. It is also noted that during this etch, the portions of the STI 112 that were exposed during the resist patterning are also removed. This feature is convenient since the wordlines will be formed opening 132. The formation of opening 132 is illustrated in FIG. 11.

After forming opening 132, strap 134 is formed. To accomplish this, a portion of collar oxide 124 is removed and the recessed area is filled with a conductive material such as doped polysilicon. The strap is provided to electrically couple polysilicon region 126 (which will be one plate of the DRAM cell capacitor) with active area 114 (one of the source/drain regions of the cell's pass transistor). The strap connects the active area to the trench and the node diffusion is formed by dopant (e.g., arsenic) outdiffusion from the trench.

Referring now to FIG. 12, trench top oxide (TTO) 136 is formed at the bottom of opening 132. The TTO is formed by deposition in a high-density plasma (HDP) oxide chamber where more oxide is deposited on the planar surface compared to the sidewall.

Referring to FIG. 13, after the TTO 136 is formed, the pad nitride 102 can be removed. A gate dielectric 138 (typically an oxide such as SiO$_2$) is formed along the wall of opening 132 and then the remainder of the opening can be filled with a conductive material 140 such as doped polysilicon. The conductive region 140 will serve as the gate for the adjacent pass transistor and also as the wordline. If desired, a silicide layer (not shown) could be formed above the polysilicon material 140 to increase the conductivity of the wordline.

The polysilicon material 140 can then be etched below the surface of silicon active area 114 selective to the pad oxide below the pad nitride. The conductive layer 140 can then be capped with an isolation layer 142, e.g., silicon dioxide. This structure is shown in FIG. 14. The isolation layer 142 will serve to isolate the wordline 140 from the bitline 144, shown in FIG. 15.

Bitlines 144 are formed by depositing and patterning metal lines over the surface of the device. In the preferred embodiment, tungsten lines are formed over the surface. Since the bitlines 144 directly contact active area 114, no bitline contact is required. This provides an advantage over prior art processes.

The preceding example has a number of other advantages over prior art processes. As one example, it is advantageous to form the active area 114 and deep trench 122 using a single self-aligned step. In this case, this was achieved by forming a first layer (e.g., polysilicon 104) over the semiconductor region 100. The first layer was then patterned to remove portions and those portions were filled with a second material (e.g., oxide 120). After the remainder of the first layer was removed, a trench that was substantially aligned to the second material could be etched in the semiconductor region 100.

FIGS. 16–19 illustrate a second embodiment DRAM process flow that also utilizes this advantage. As with the first embodiment, a single-sided junction device will be formed. This process uses substantially the same steps as the first embodiment described and therefore description of these steps will not be repeated. Reference can be made to FIGS. 2–8 for the beginning process steps.

Figure 16A:
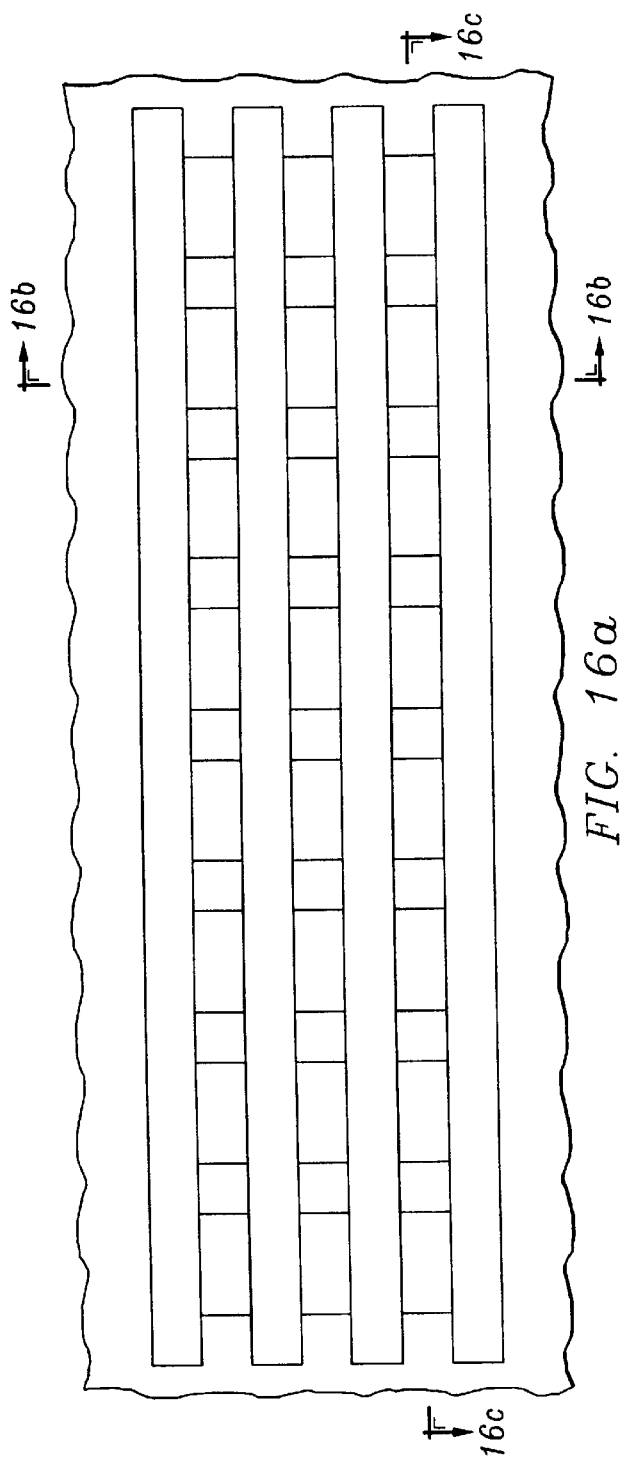
FIGS. 16–19 illustrate cross-sectional views of a second embodiment process flow to form a DRAM using the trench of FIG. 8.
Figure 16C:
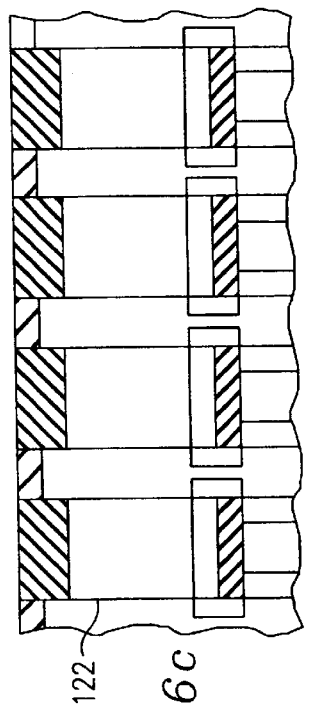
Figure 16B:
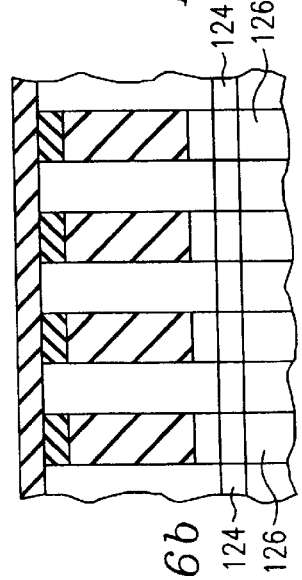

Referring back to FIG. 8, the deep trench 122 has been formed. FIG. 16 illustrates a number of process steps including strap information, TTO deposition, pad nitride strip, implants, gate oxide and gate conducter deposition. In particular, polysilicon 126 is recessed to a predetermined distance (typically about 600 nm) above the collar 124. The TTO can then be deposited over the entire width of deep trench 122. This modification can provide an advantage when depositing the oxide across the entire width of the trench is easier than depositing over a portion (e.g., half) of the trench.

An outdiffusion is performed to form the source of the pass transistor. In this case, the outdiffusion is performed on both sides of the trench even though the pass transistor is at one side. This should not be detrimental so long as the deep trenches are spaced far enough so that the outdiffusion from one trench does not interact with the outdiffusion of an adjacent trench. The outdiffusion from the trench occurs due to thermal processing post buried strap formation.

The trench can then be refilled with a conductive material such as doped polysilicon. After the polysilicon is recessed, a thin oxide deposition is performed.

Figure 17A:
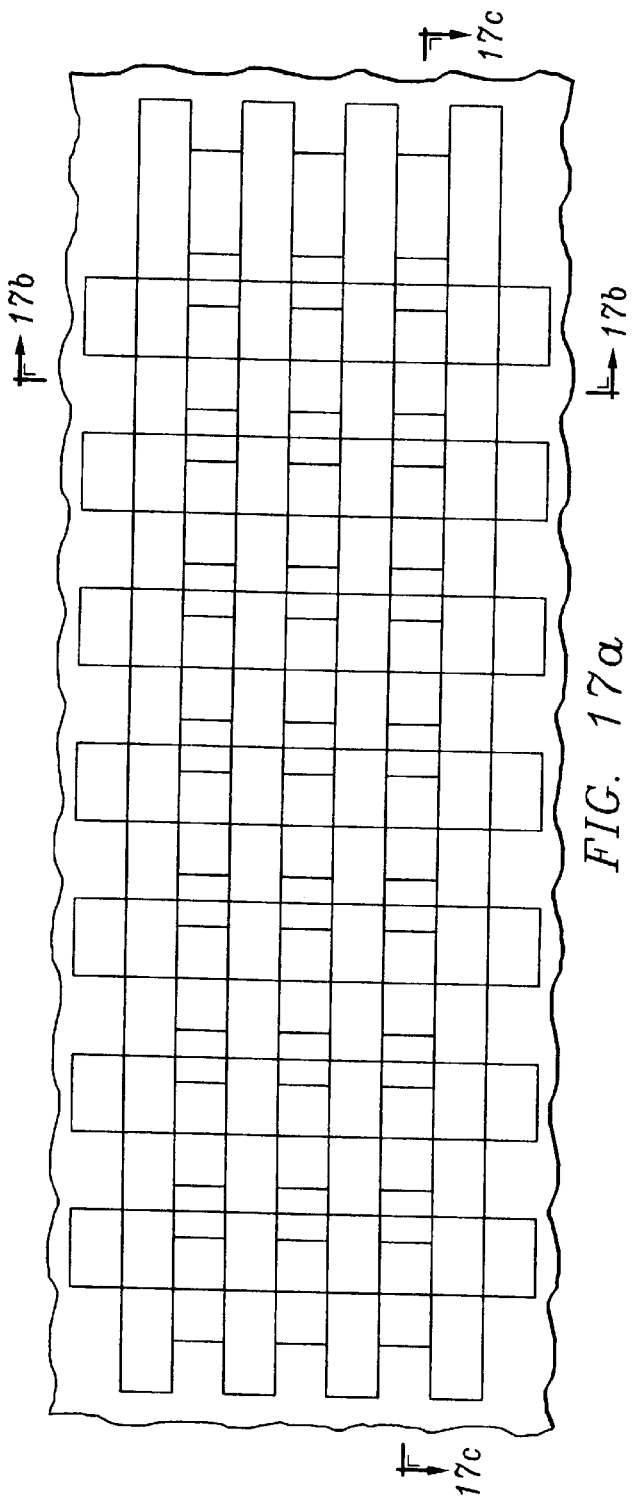
Figure 17C:
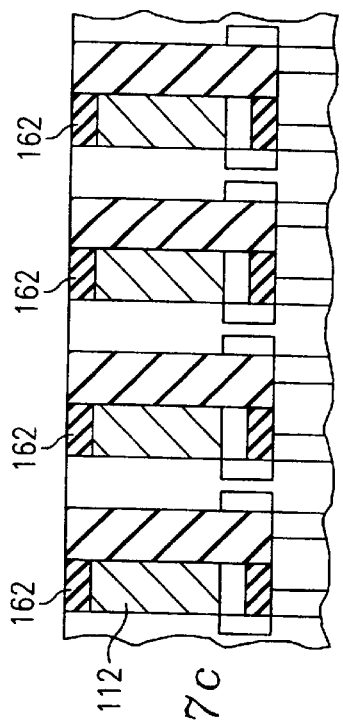
Figure 17B:
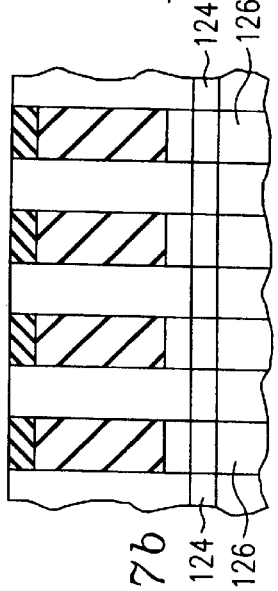

Referring next to FIG. 17, the single sided device is formed by applying a cut mask and etching the polysilicon all the way down to the trench locos collar. In performing this step, an exposed portion of the TTO will also be removed. Since a polysilicon etch is being performed, the STI will not be removed (as it was in the first embodiment).

Figure 18A:
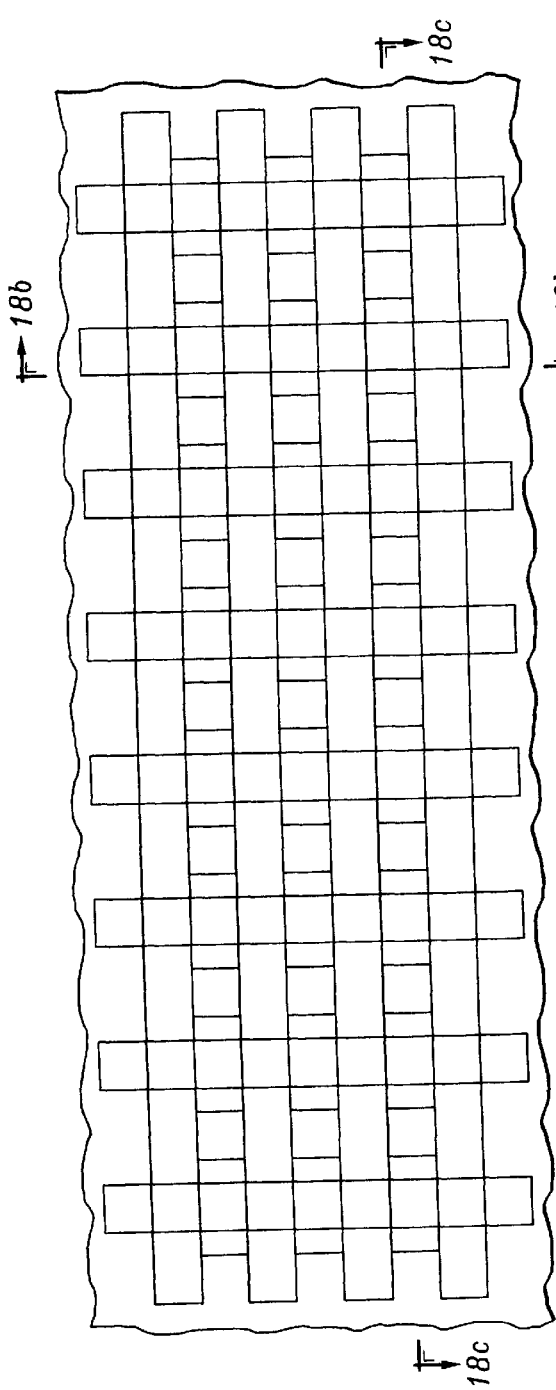
Figure 18C:
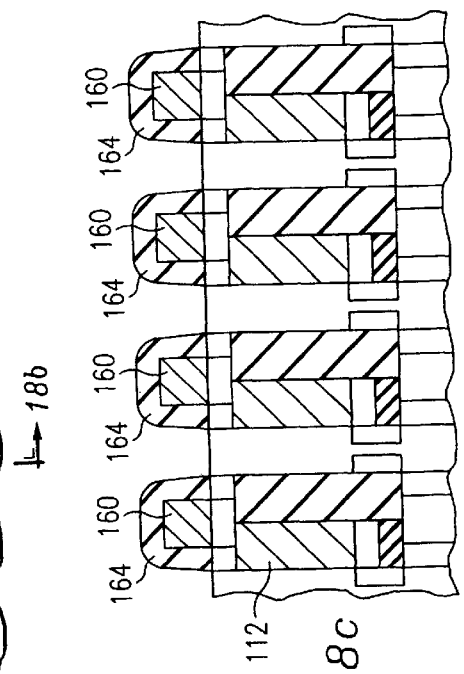
Figure 18B:
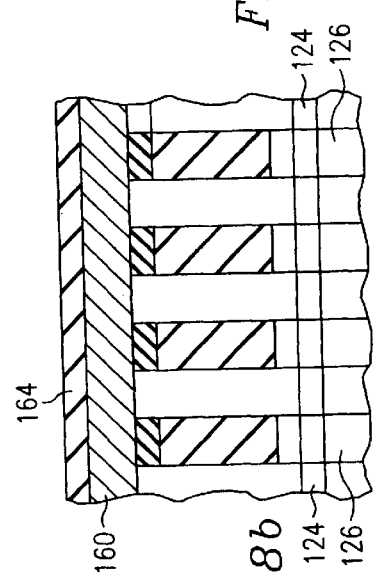

At this point, one of two options can be used. In a first, a damascene gate level is used and in the second a more conventional gate RIE process is used. For a gate RIE process, the oxide 162 is etched to the polysilicon 112 and a gate stack 160 is deposited. This gate stack typically comprises either doped polysilicon or a metal such as a silicide or a composite layer of both. FIG. 18 illustrates the wordline gate stack 160 coupled to the gate conductor 112 and extending over the array. The wordline conductor is surrounded by an insulating layer 164 such as a nitride (e.g., $Si_3N_4$).

One advantage of performing the wordline in this manner is that it can be formed simultaneously with the gate conductors of the periphery devices. In other words, no additional process steps are necessary since the other devices already need to be formed.

Figure 19A:
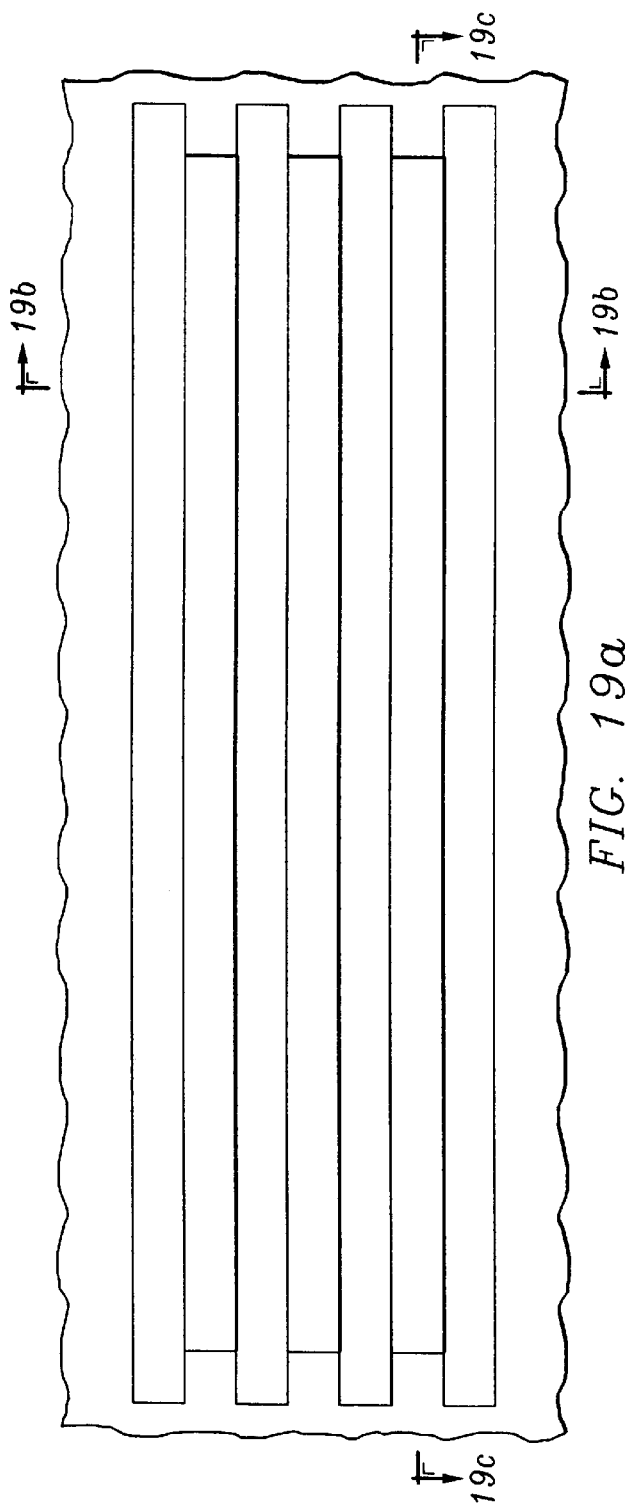
Figure 19C:
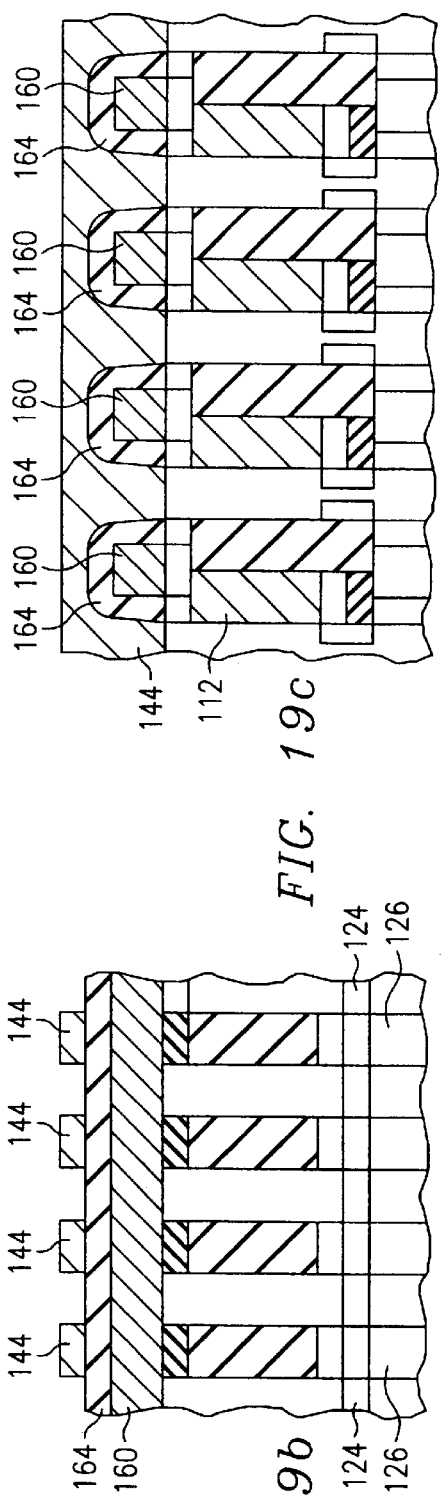
Figure 19B:
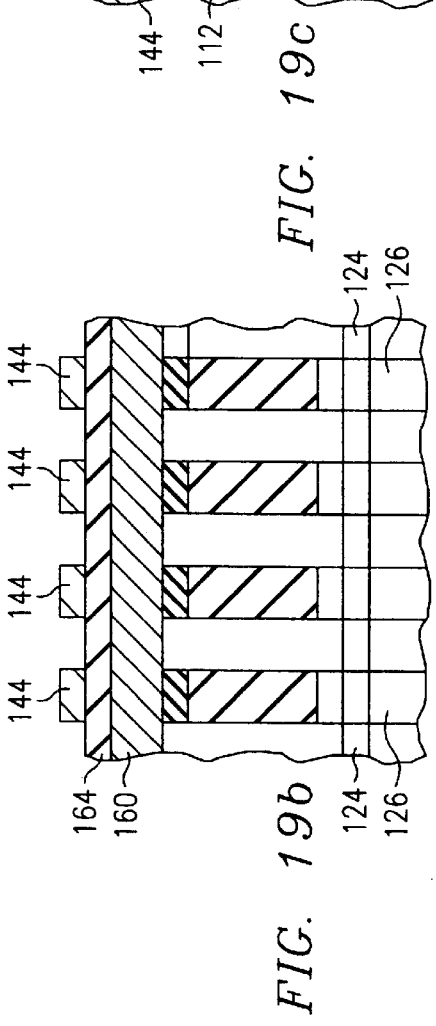

Referring finally to FIG. 19, the bitlines 144 are formed by depositing metal (e.g., tungsten) and planarization (e.g., by CMP). The metal is patterned with 1F lines spaces at a 2F pitch. This step forms the first level of metal and the borderless contact in one step.

Referring to FIGS. 20–23, a third embodiment DRAM process flow is described. This process uses substantially the same steps as the first embodiment described and therefore description of these steps will not be repeated. Reference can be made to FIGS. 2–10 for the beginning process steps.

Figure 20A:
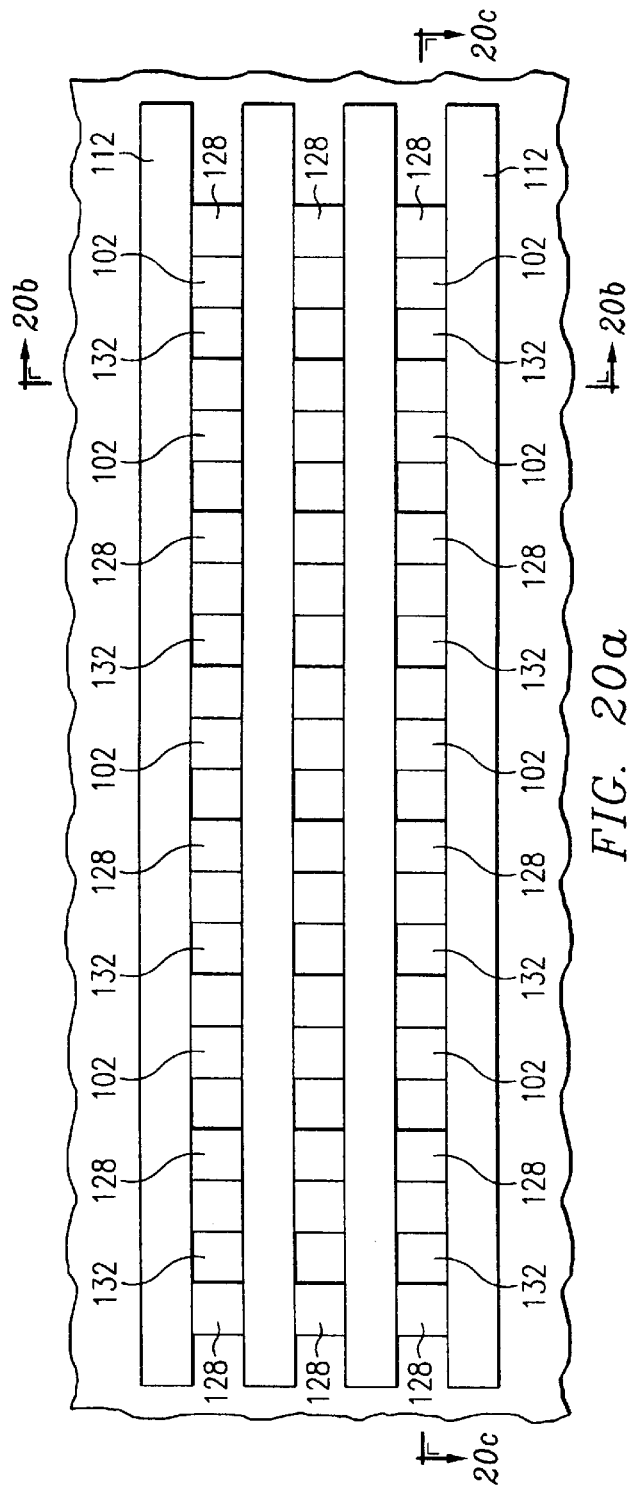
Figure 20C:
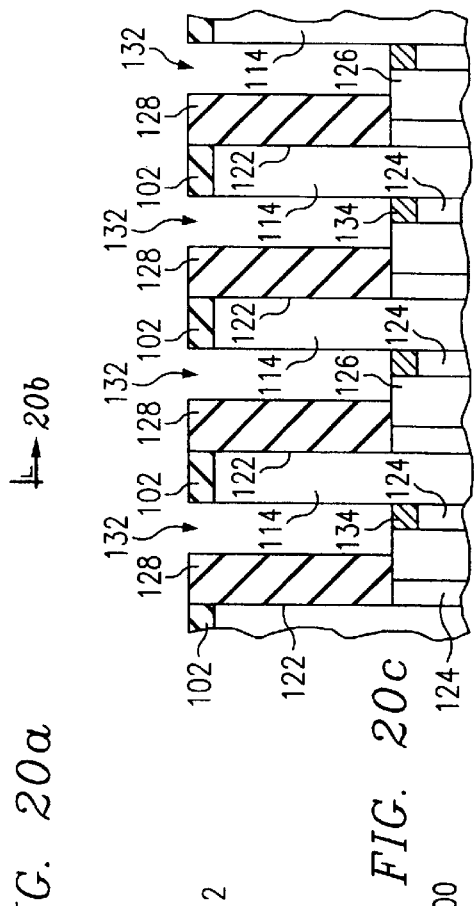
Figure 20B:
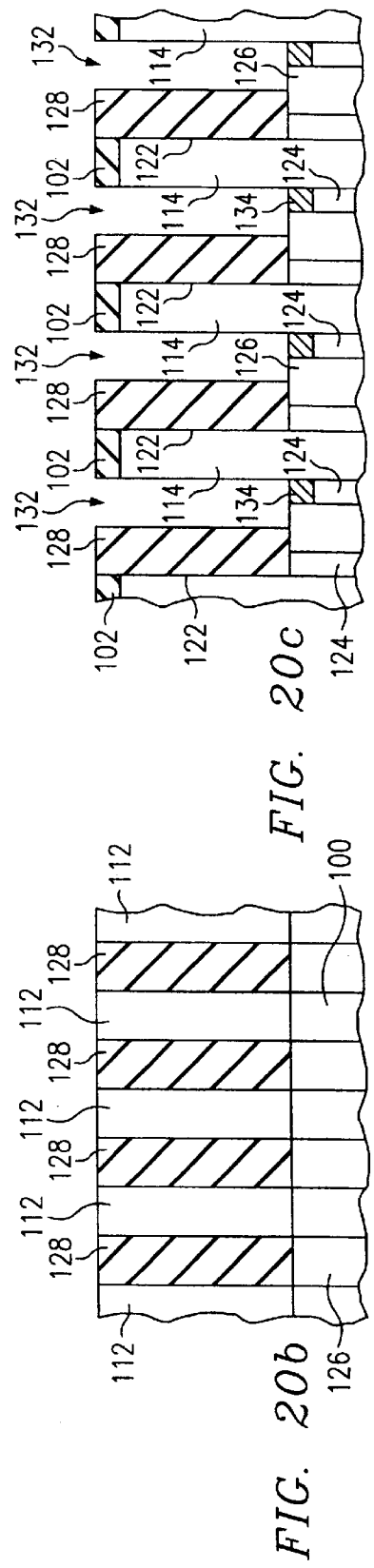

In FIG. 20, the oxide 128 is removed from a portion of deep trench 122 to form opening 132. Unlike the previous process, however, the STI 112 is not etched at this time. Alternatively, the STI can be removed as before. As shown in FIG. 20, the strap 134 is also formed at this time.

Referring to FIG. 21, as in the first embodiment, the trench top oxide 136, gate conductor 138 and isolation region 142 are formed. These steps can be performed as described above.

Referring to FIG. 22, a metal layer (such as tungsten, as an example) is formed and patterned over active area 114. This metal layer can serve as the bitline without need for bitline contacts. In this example, the bitlines 144 have a 1F width with a 3F pitch and are completely encapsulated with an insulating material, for example a nitride material (e.g., $Si_3N_4$).

Figure 23A:
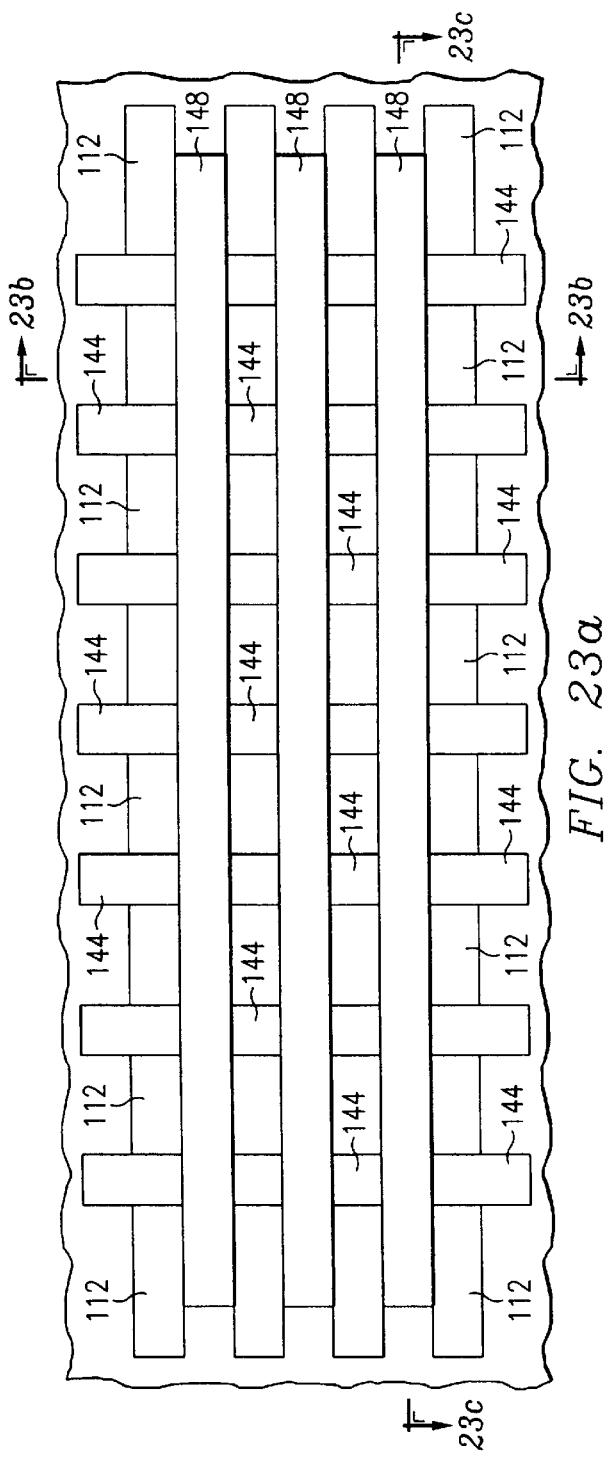
Figure 23C:
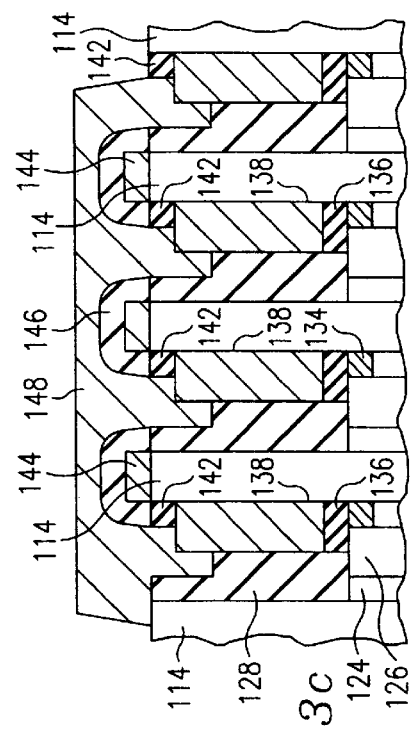
Figure 23B:
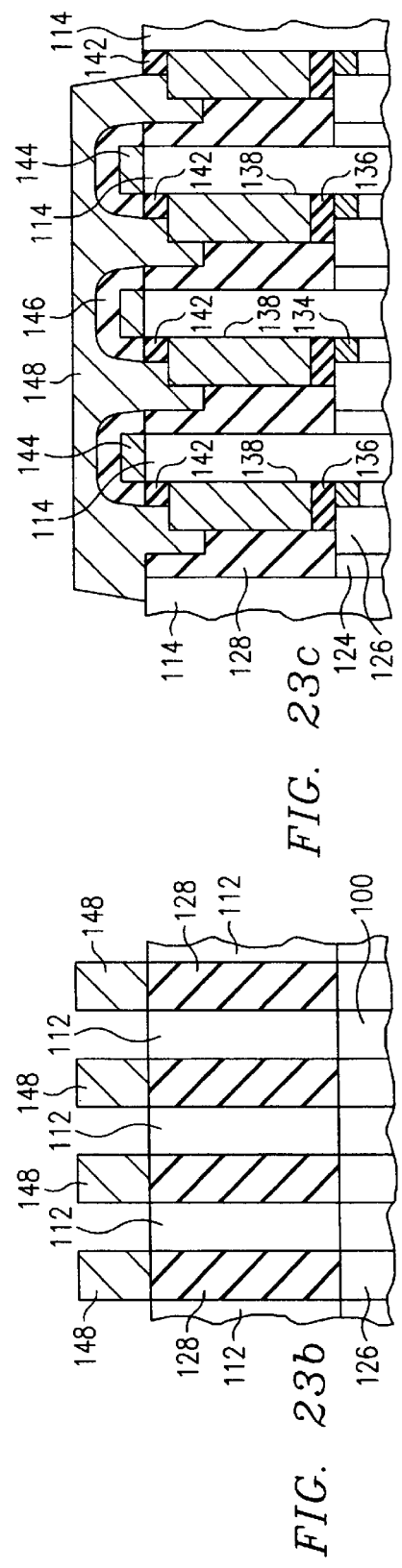

Referring to FIG. 23, the gate conductor wiring (i.e., wordline) 148 is done with a damascene step. The gate conductor may also be formed from a metal such as tungsten and is formed with a 1F spacing and a 2F pitch. To form the wordline 148, oxide regions 128 and 142 are etched to expose polysilicon region 138. This etch is selective to the nitride encapsulation 146. The wordline can then contact the gate conductor of each memory cell in the array.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a trench in a semiconductor region, the method comprising:

forming a polysilicon layer over the semiconductor region;

patterning the polysilicon layer to remove portions of the polysilicon;

depositing a second material to fill the portions where the polysilicon was removed;

removing the remaining portions of the polysilicon layer; and etching a trench in the semiconductor region, the trench substantially aligned to the second material.

2. The method of claim 1 wherein the polysilicon comprises a patterned sacrificial layer and wherein the trench comprises a self aligned trench and wherein the patterned sacrificial layer defines a trench opening.

3. A method of forming a trench in a semiconductor region, the method comprising:

forming a first layer of a first material over the semiconductor region, wherein the first material comprises polysilicon;

patterning the first layer to remove portions of the first material;

depositing a second material to fill the portions where the first material was removed, wherein the second material comprises an oxide;

removing the remaining portions of the first layer of first material; and etching a trench in the semiconductor region, the trench substantially aligned to the second material.

4. The method of claim 3 and further comprising forming a nitride layer over the semiconductor region and then forming the first layer over the nitride layer.

5. The method of claim 4 wherein patterning the first layer to remove portions of the first material further comprises removing portions of the nitride layer.

6. A method of forming a trench in a semiconductor region, the method comprising:

forming a nitride layer over the semiconductor region;

forming a polysilicon layer over the nitride layer;

patterning the polysilicon layer to remove portions of the polysilicon layer;

depositing an oxide material to fill the portions where the polysilicon was removed;

removing remaining portions of the polysilicon layer and underlying portions of the nitride layer; and etching a trench in the semiconductor region, the trench substantially aligned to the oxide.

7. The method of claim 6 and further comprising forming a capacitor in the trench.

8. The method of claim 6 wherein removing remaining portions of the polysilicon layer further comprises removing portions of the nitride layer to expose the semiconductor region.

9. The method of claim 6 where depositing an oxide material comprises depositing an oxide material by the decomposition of tetraethyloxysilane (TEOS).

10. The method of claim 6 and further comprising performing a planarization after depositing the oxide material and before removing remaining portions of the polysilicon layer.

11. The method of claim 10 wherein the planarization comprises a chemical-mechanical polish.

12. A method of forming an array of trenches in a semiconductor region, the method comprising:

forming a first layer of a first material over the semiconductor region;

patterning the first layer to remove portions of the first material, the remaining portions comprising an array of portions wherein each portion, viewed from a plan view, comprises a rectangle that measures about 1F×2F and wherein each of the remaining portions is spaced from another one of the remaining portions by a distance of about 1F, wherein F comprises a feature size;

depositing a second material to fill the portions where the first material was removed;

removing the remaining portions of the first layer of first material; and etching a plurality of trenches in the semiconductor region, the plurality of trenches being substantially aligned to the second material, each of the trenches having a circumference substantially in the shape of a rectangle that measures about 1F×2F.

13. The method of claim 12 wherein F comprises a minimum feature size.

14. The method of claim 12 wherein the first material comprises polysilicon and wherein the second material comprises an oxide.

15. The method of claim 14 and further comprising forming a nitride layer over the semiconductor region and then forming the first layer over the nitride layer.

16. The method of claim 15 wherein patterning the first layer to remove portions of the first material further comprises removing portions of the nitride layer.

17. The method of claim 12 wherein the trench is lined with a dielectric layer and filled with a conductor so as to form a capacitor.

18. A method of forming a trench in a semiconductor region, the method comprising:

forming a first layer of a first material over the semiconductor region;

patterning the first layer to remove portions of the first material;

depositing a second material to fill the portions where the first material was removed;

removing the remaining portions of the first layer of first material; and etching a rectangular-shaped trench in the semiconductor region, the trench substantially aligned to the second material.

19. The method of claim 18 wherein the rectangular-shaped trench has a dimension of about 1F×2F.

20. The method of claim 19 wherein F is the minimum feature size.

21. The method of claim 20 wherein F is about 150 nm.

22. The method of claim 18 wherein the first material comprises polysilicon.

23. The method of claim 18 wherein the second material comprises an oxide.

24. The method of claim 18 wherein the trench is lined with a dielectric layer and filled with a conductor so as to form a capacitor.

25. A method of forming a trench capacitor in a semiconductor region, the method comprising:

forming a first layer of a first material over the semiconductor region;

patterning the first layer to remove portions of the first material;

depositing a second material to fill the portions where the first material was removed;

removing the remaining portions of the first layer of first material; and etching a trench in the semiconductor region, the trench substantially aligned to the second material, wherein the trench is lined with a dielectric layer and filled with a conductor so as to form a capacitor.

* * * * *